US006856211B2

(12) United States Patent
Yamada et al.

(10) Patent No.: US 6,856,211 B2
(45) Date of Patent: Feb. 15, 2005

(54) COAXIAL TYPE IMPEDANCE MATCHING DEVICE

(75) Inventors: Fumio Yamada, Nagano (JP); Toshiaki Kitamura, Nagano (JP); Hiroyuki Kobayashi, Nagano (JP); Koichi Rokuyama, Nagano (JP); Akihiro Kubota, Nagano (JP); Shigeru Kasai, Yamanashi (JP); Takashi Ogino, Yamanashi (JP); Yuki Osada, Yamanashi (JP)

(73) Assignees: Nagano Japan Radio Co., Ltd., Nagano (JP); Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/441,906

(22) Filed: May 20, 2003

(65) Prior Publication Data

US 2004/0023561 A1 Feb. 5, 2004

(30) Foreign Application Priority Data

May 30, 2002 (JP) ....................................... 2002-157692
May 21, 2002 (JP) ....................................... 2002-146279
May 28, 2002 (JP) ....................................... 2002-153615

(51) Int. Cl.[7] ............................. H03H 7/38; H01Q 1/50
(52) U.S. Cl. ........................... 333/35; 333/258; 333/33; 343/864; 343/790; 343/786
(58) Field of Search ............................ 333/35, 33, 258; 343/786, 790, 864

(56) References Cited

U.S. PATENT DOCUMENTS 4,851,859 A * 7/1989 Rappaport .................. 343/790
5,317,293 A * 5/1994 Bacon et al. ............... 333/258
5,371,509 A * 12/1994 Wallace et al. ............. 343/741
5,945,634 A * 8/1999 Shimirak et al. ........... 333/136
6,222,500 B1 * 4/2001 Koitsalu et al. .............. 333/33
6,369,603 B1 * 4/2002 Johnston et al. ............ 324/766
6,657,601 B2 * 12/2003 McLean ..................... 343/792

OTHER PUBLICATIONS

"Communication Engineering Handbook", Maruzen Co., Ltd., p. 612, Section 5.3.3. (1957) and Partial English Translation, 3 pages.

* cited by examiner

*Primary Examiner*—Michael Tokar
*Assistant Examiner*—Lam T. Mai
(74) *Attorney, Agent, or Firm*—Osha & May L.L.P.

(57) ABSTRACT

A coaxial type impedance matching device includes a matching device body including an external conductor and an internal conductor arranged in the external conductor, an input side dielectric disposed in the matching device body and including a first dielectric and a second dielectric, and an output side dielectric disposed in the matching device body and including a third dielectric and a fourth dielectric. Distance between opposed surfaces of the first dielectric and the second dielectric is a predetermined distance, which is in a range of Nλ/4−λ/6 to Nλ/4−λ/6, where λ represents a guide wavelength of an input signal in the matching device body and N represents odd number. Distance between opposed surfaces of the third dielectric and the fourth dielectric is the predetermined distance.

21 Claims, 11 Drawing Sheets

COAXIAL TYPE IMPEDANCE MATCHING DEVICE

The present invention relates to the subject matter contained in Japanese Patent Application No. 2002-146279 filed on May 21, 2002, Japanese Patent Application No. 2002-153615 filed on May 28, 2002, and Japanese Patent Application No. 2002-157692 filed on May 30, 2002, which are incorporated herein by reference in its entirety.

BACKGROUND OF THE INVENTION

1. Field of the Invention

The present invention relates to a coaxial type impedance matching device, in which dielectrics are housed in sliding manners in a matching device body having an external conductor and an internal conductor.

2. Description of the Related Art

A double-slug tuner disclosed in "A Communication Engineering Handbook (Maruzen Co., Ltd., 1957)" has been known as a coaxial type impedance matching device of this kind.

Here, the double-slug tuner has the following problems to be solved. In this double-slug tuner, more specifically, the impedance is matched by sliding two slugs in the matching device body. In this double-slug tuner, however, the impedance matching range retained is narrow in a range of VSWR (Voltage Standing Wave Ratio) from about 1 to 10 so that its widening is desired. On the other hand, the impedance matching range can be widened by increasing the number of slugs. However, the adoption of this construction raises a problem that the position adjustment of the slugs is seriously complicated.

Also, external connectors are connected to connectors, which are provided at an input portion and an output portion of the matching device body, so that in this double-slug tuner, the matching device body is connected to an amplifier and an antenna through coaxial cables. In this case, the contact resistances exist between an external electrode and the external conductor of the double-slug tuner. The contact resistances cause slight reduction in the gain of the double-slug tuner. It is, therefore, desired to improve the gain reduction. Moreover, the connectors and the matching device body are made separate and have to be mounted on the matching device body. This results in a rise of the cost, which is preferably lowered. In this double-slug tuner, moreover, when a signal S of a high output is inputted, a spark may occur between an internal conductor and sliding fittings attached to the slugs. It is preferable to improve this point.

Furthermore, in this double-slug tuner, the electromagnetic waves may leak from a slit formed in the external conductor. It is preferred to improve this problem.

SUMMARY OF THE INVENTION

The present invention has been conceived in view of those points of improvement and has an object to provide a coaxial type impedance matching device, which can enlarge the impedance matching range with an easy adjustment.

The invention has another object to provide a coaxial type impedance matching device, which can be manufactured at a reasonable price while avoiding the drop of the gain, as might otherwise be caused by the contact resistances between the connectors and the matching device body. Further another object is to provide a coaxial type impedance matching device, which can avoid the occurrence of a spark when a signal of a high output is inputted.

The invention also has still another object to provide a coaxial type impedance matching device, which can reduce the leakage of the electromagnetic waves to the outside while making the impedance adjustment possible from the outside.

A coaxial type impedance matching device according to a first aspect of the invention, includes a matching device body including a tubular external conductor and an internal conductor arranged in the external conductor, an input side dielectric disposed in the matching device body and including a first dielectric and a second dielectric, and an output side dielectric disposed in the matching device body and including a third dielectric and a fourth dielectric. The input side dielectric and the output side dielectric are slidable between a signal input portion of the matching device body and a signal output portion of the matching device body to adjust distance between a center position between the input side dielectric and the output side dielectric and one of the signal input portion and the signal output portion, and to adjust distance between opposed surfaces of the input side dielectric and the output side dielectric. Distance between opposed surfaces of the first dielectric and the second dielectric is a predetermined distance, which is in a range of $N\lambda/4-\lambda/6$ to $N\lambda/4-\lambda/6$, where $\lambda$ represents a guide wavelength of an input signal in the matching device body and N represents odd number. Distance between opposed surfaces of the third dielectric and the fourth dielectric is the predetermined distance.

In this case, the following construction is preferable. The first dielectric and the second dielectrics are connected by a first connecting member in a state where the first dielectric and the second dielectric are spaced at the predetermined distance. The third dielectric and the fourth dielectrics are connected by a first connecting member in a state where the first dielectric and the second dielectric are spaced at the predetermined distance. More preferably, the coaxial type impedance matching device further includes moving mechanisms for moving the first connecting member and the second connecting member, respectively.

Also, it is preferable that N is 1.

A coaxial type impedance matching device according to a second aspect of the invention, includes a matching device body including a tubular external conductor and an internal conductor arranged in the external conductor, an input side dielectric disposed in the matching device body, and an output side dielectric disposed in the matching device body. The input side dielectric and the output side dielectric are slidable between an signal input portion of the matching device body and a signal output portion of the matching device body. The matching device body includes a connector portion for connecting to an external device. The internal conductor and the external conductor protrude by a predetermined length from at least one of the signal input portion and the signal output portion to form the connector portion.

In this case, the following construction is preferable. The internal conductor and the external conductor protrude by a predetermined length from both of the signal input portion and the signal output portion to form the connector portion.

Also, the following construction is preferable. The the internal conductor form a center electrode of the connector portion at at least one of the signal input portion and the signal output portion. An inserting hole to which a center electrode of a connection object is inserted is formed at the center electrode of the connector portion at the at least one of the signal input portion and the signal output portion. The external conductor has a length not shorter than the internal conductor so that the at least one of the signal input portion and the signal output portion of the external conductor forms an external electrode of the connector portion.

In addition, it is preferable that the coaxial type impedance matching device further includes holding dielectrics disposed individually at positions corresponding to the signal input portion and the signal output portion of the matching device body, the holding dielectrics for holding the internal conductor at a predetermined position in the external conductor.

Also, it is preferable that the external conductor is formed of a cylindrical member.

In addition, the following construction is preferable the coaxial type impedance matching device further includes brackets fixed on the input side dielectric and the output side dielectric, respectively. The external conductor has a slit formed between the signal input portion and the signal output portion, the slit for allowing each of brackets to protrude and to slide to an outside of the external conductor.

Also, the following construction is preferable. The input side dielectric and the output side dielectric have fitting groove portions for fitting the brackets, respectively. Each of brackets have a pair of fitting pawl portions to be fitted in the fitting groove portions.

A coaxial type impedance matching device according to a third aspect of the invention, includes a tubular external conductor, an internal conductor disposed in the external conductor and constructing a transmission line for a signal together with the external conductor, dielectrics disposed in clearance between an inner face of the external conductor and an outer face of the internal conductor, the dielectric being movable in a longitudinal direction of the internal conductor, position changing means for changing a position of the dielectric in the longitudinal direction of the internal conductor from outside of the external conductor, and a shielding mechanism for reducing leakage of electromagnetic waves caused by the signal.

In this case, the following construction is preferable the external conductor has a slit formed in the longitudinal direction of the internal conductor. The position changing means includes moving brackets, one end of which are connected to the dielectrics and the other ends of which protrude to the outside of the external conductor through the slit. The shielding mechanism includes block members for blocking the slit at least partially while allowing the moving brackets to move along the slit.

Also, it is preferable that the block members are connected to the moving brackets so that the block members move integrally with the dielectrics.

Also, it is preferable that the dielectrics have fitting groove portions for fitting the moving brackets, and that each of moving brackets has a pair of fitting pawl portions to be fitted in each of fitting groove portion.

Also, the following construction is preferable. Each of block members is formed into a plate shape, and has a length so as to block the slit as a whole, and is disposed to be relatively movable with respect to the external conductor at a portion where the slit is formed. Cam grooves are formed on a surface of the block members where the block members face to the external conductor, the cam grooves into which the other ends of the moving brackets enter intersect the longitudinal direction of the internal conductor obliquely. When the block members move relative to the external conductor, the moving brackets move along the slit in a state where the moving brackets are guided by the cam grooves, to move the dielectrics in the longitudinal direction of the internal conductor.

Also, the following construction is preferable. The block members are formed into a plate shape, and have a length so as to block the slit as a whole, and are disposed to be parallel to the external conductor and to be turnable at a portion where the slit is formed. Cam grooves are formed on outer surfaces of the block members so that the other ends of the moving brackets enter into the cam grooves and the cam grooves intersect the longitudinal direction of the internal conductor obliquely. When the block members turns, the moving brackets moves along the slit in a state where the moving bracket are guided by the cam grooves, to move the dielectrics in the longitudinal direction of the internal conductor.

Also, the following construction is preferable. The shielding mechanism includes a dish member reserved with a liquid metal having conductivity. The external conductor is arranged in the dish member with a portion where the slit is formed faces downward so that the portion where the slit is formed is filled with the liquid metal. The moving brackets are disposed so that the one ends thereof are buried in the liquid metal and that the other ends thereof are exposed from the liquid metal. Also, it is preferable that the external conductor has through holes communicating inside and outside thereof, and that the position changing means includes rods inserted slidably into the through holes and connected to the dielectrics at inserted side leading end portions thereof.

A coaxial type impedance matching device according to a fourth aspect of the invention includes a tubular external conductor erected upright, an internal conductor disposed in the external conductor, for constructing a transmission line for a signal together with the external conductor, and a pair of cover members disposed in clearance between an inner face of the external conductor and an outer face of the internal conductor, the cover members disposed at a spacing from each other. Opposed surfaces of the cover members, the inner face of the external conductor, and the outer face of the internal conductor form a liquid chamber. The external conductor includes a liquid pumping port for pumping a liquid dielectric from a lower side of the liquid chamber into the liquid chamber, and an air hole communicating with an upper side of the liquid chamber.

Also, it is preferable that the coaxial type impedance matching device further includes a shielding case covering the coaxial type impedance matching device to reduce leakage of electromagnetic waves caused by the signal.

DETAILED DESCRIPTION OF THE PREFERRED EMBODIMENTS

First Embodiment

A preferred embodiment of a coaxial type impedance matching device according to the invention will be described with reference to the accompanying drawings.

Figure 1:
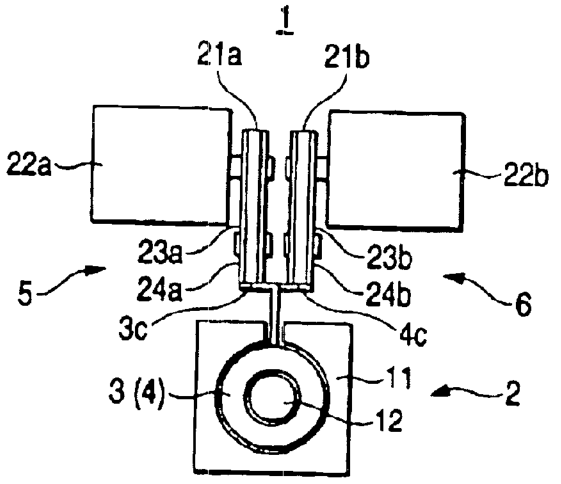
FIG. 1 is a front elevation showing a slug tuner 1 according to an embodiment of the invention when viewed from the side of the input end 2*a*.
Figure 2:
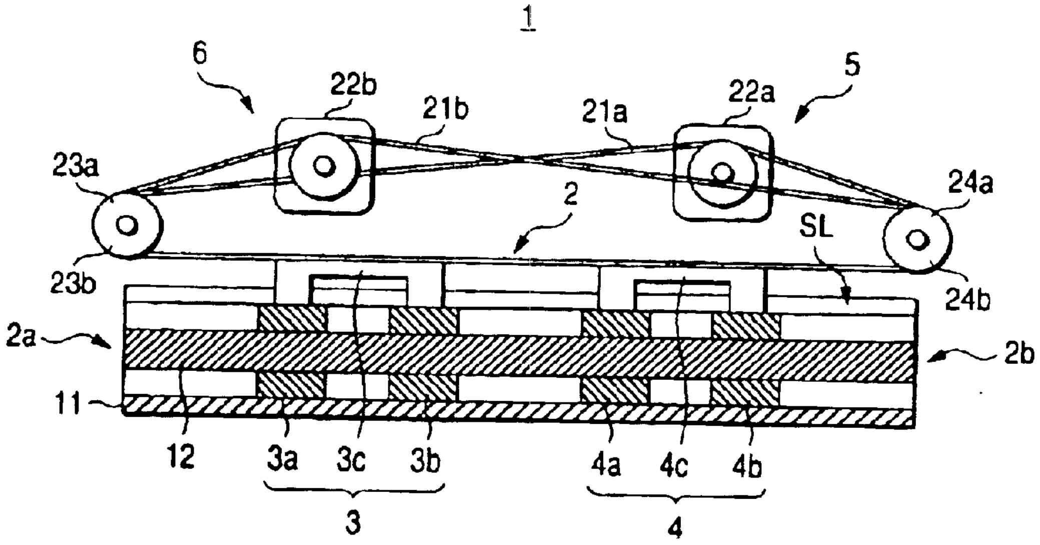
FIG. 2 is a sectional side elevation of the slug tuner 1.
Figure 4:
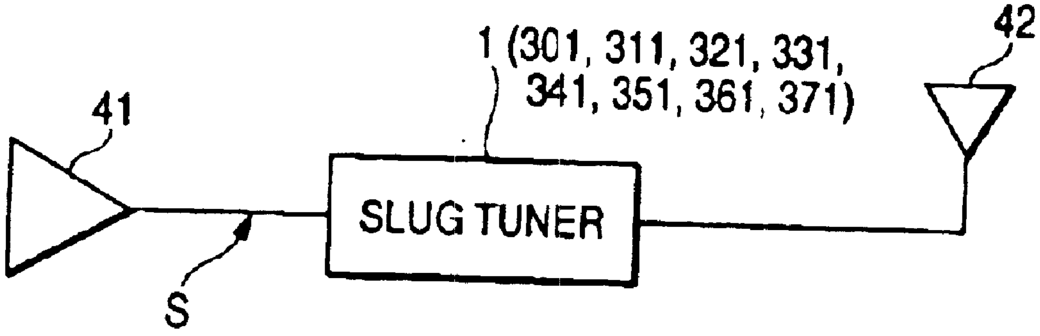
FIG. 4 is a block diagram showing one example of the state, in which the slug tuner 1 is connected with an amplifier 41 and an antenna 42.
Figure 5:
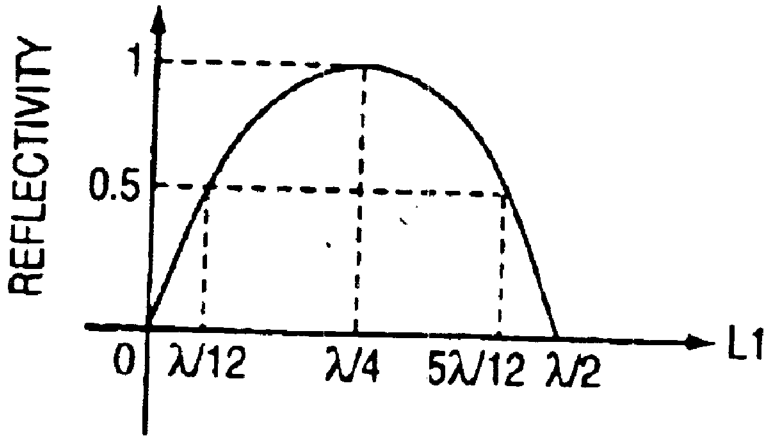
FIG. 5 is an explanation view showing change of the reflectivity when the thickness L1 of a slug 3*a* is changed.

A slug tuner 1, as shown in FIGS. 1 and 2, is an example of the coaxial type impedance matching device according to the invention and is provided with a matching device body 2, an input side slug 3, an output side slug 4 and moving mechanisms 5 and 6. This slug tuner 1 is arranged, for example, between an amplifier 41 and an antenna 42, as shown in FIG. 4. By matching the impedances between the amplifier 41 and the antenna 42, a signal S (as exemplified to have a frequency of 2.45 GHz) outputted from the amplifier 41 is substantially completely outputted with little reflection to the antenna 42. As shown in FIGS. 1 and 2, the matching device body 2 is provided with an external conductor 11 of a square-cylinder shape (or tubular shape) having a circular bore formed longitudinally of its center, and a bar-shaped internal conductor 12 housed in the circular bore of the external conductor 11. In this case, the (not-shown) connectors for connecting coaxial cables to be connected with the amplifier 41 and the antenna 42 are attached to the input end 2*a* and the output end 2*b* of the matching device body 2. In the external conductor 11, moreover, there is longitudinally formed a slit for protruding a connecting fitting 3*c* (or a first connector) and a connecting fitting 4*c* (or a second connector) for mounting the input side slug 3 and the output side slug 4 on the moving mechanisms 5 and 6, respectively.

The input side slug 3 corresponds to an input side dielectric in the invention and is provided with slugs 3*a* and 3*b* made of a dielectric material, and the connecting fitting 3*c* for mounting the slugs 3*a* and 3*b* in the connected state on the moving mechanism 5. In this case, the slugs 3*a* and 3*b* correspond to first and second dielectrics of the invention, respectively, and are formed into a circular-cylinder shape having a thickness L1 regulated to meet $\lambda/4-\lambda/6 \leqq L1 \leqq \lambda/4+\lambda/6$ (wherein λ indicates a guide wavelength of the signal S in the matching device body 2). Preferably, L1 is equal to λ/4. Here, assuming that when L1 is equal to λ/4, a slug (for example, the slug 3*a*) has the reflection factor of 1. Under this assumption, when $L1=\lambda/4\pm\lambda/6$, the reflection factor of the slug becomes 0.5 (that is, performance of the slug decreases to half). Therefore, the thickness of the slugs 3*a* and 3*b* are regulated to meet $\lambda/4-\lambda/6 \leqq L1 \leqq \lambda/4+\lambda/6$ as described above.

Moreover, the slugs 3*a* and 3*b* are so fixedly connected by the connecting fitting 3*c* that the spacing distance L2 between their opposed faces is adjusted in advance to meet $N\lambda/4-\lambda/6 \leqq L2 \leqq N\lambda/4+\lambda/6$ (wherein N: an odd number). Preferably, L2 is equal to Nλ/4. When the spacing distance L2 between the two slugs 3*a* and 3*b* is regulated to Nλ/4, therefore, the individual phases are substantially equalized among the signal S, which is reflected on the end face of the slug 3*a* on the side of the input end 2*a* and outputted to the side of the input end 2*a*, the signal S, which is reflected on the end face of the slug 3*a* on the side of the output end 2*b* and outputted through the slug 3*a* to the side of the input end 2*a*, the signal S, which is reflected on the end face of the slug 3*b* on the side of the input end 2*a* and outputted through the slug 3*a* to the side of the input end 2*a*, and the signal which is reflected on the end face of the slug 3*b* on the side of the output end 2*b* and outputted through the slug 3*b* and slug 3*a* to the side of the input end 2*a*. Therefore, the amount of reflection of the input side slug 3 as a whole to the side of the input end 2*a* is sufficiently larger than that of one slug 53 in the slug tuner 51.

The output side slug 4 corresponds to an output side dielectric in the invention and is provided with slugs 4*a* and 4*b* made of a dielectric material, and the connecting fitting 4*c* for mounting the slugs 4*a* and 4*b* in the connected state on the moving mechanism 6. In this case, the slugs 4*a* and 4*b* correspond to third and fourth dielectrics of the invention, respectively, and are formed into a circular-cylinder shape having a thickness L1 regulated to meet $\lambda/4-\lambda/6 \leqq L1 \leqq \lambda/4+\lambda/6$. Moreover, the slugs 4*a* and 4*b* are so fixedly connected by the connecting fitting 4*c* that the spacing distance L2 between their opposed faces is adjusted in advance to meet $N\lambda/4-\lambda/6 \leqq L2 \leqq N\lambda/4+\lambda/6$. When the spacing distance L2 between the two slugs 4*a* and 4*b* is regulated to Nλ/4, therefore, the individual phases are substantially equalized among the signal S, which is reflected on the end face of the slug 4*a* on the side of the input end 2*a* and outputted through the input side slug 3 to the side of the input end 2*a*, the signal S, which is reflected on the end face of the slug 4*a* on the side of the output end 2*b* and outputted through the slug 4*a* and the input side slug 3 to the side of the input end 2*a*, the signal S, which is reflected on the end face of the slug 4*b* on the side of the input end 2*a* and outputted through the slug 4*a* and the input side slug 3 to the side of the input end 2*a*, and the signal which is reflected on the end face of the slug 4*b* on the side of the output end 2*b* and outputted through the slug 4*b* and slug 4*a* and the input side slug 3 to the side of the input end 2*a*. Therefore, the amount of reflection of the output side slug 4 as a whole to the side of the input end 2*a* is sufficiently larger than that of one slug in the conventional double-slug tuner. Here in the embodiment, the distance L2 between the slugs 3*a* and 3*b* and the distance L2 between the slugs 4*a* and 4*a* are regulated to λ/4.

The moving mechanisms 5 and 6 slide the input side slug 3 and the output side slug 4 separately and independently of the matching device body 2, and the moving mechanism 5 slides the input side slug 3 whereas the moving mechanism 6 slides the output side slug 4. Specifically, the moving mechanism 5 is constructed to include: a wire rope 21*a*, on which the connecting fitting 3*c* of the input side slug 3 is fixed; a motor 22*a* for sliding the input side slug 3 by turning the wire rope 21*a*; and pulleys 23*a* and 24*a*, on which the wire rope 21*a* is made to run. On the other hand, the moving mechanism 6 is constructed to include: a wire rope 21*b*, on which the connecting fitting 4*c* of the output side slug 4 is fixed; a motor 22*b* for sliding the output side slug 4 by turning the wire rope 21*b*; and pulleys 23*b* and 24*b*, on which the wire rope 21*b* is made to run. In this case, stepping motors are adopted, for example, as the motors 22*a* and 22*b* to turn the wire ropes 21*a* and 21*b* under the control of the not-shown control unit.

Figure 3:
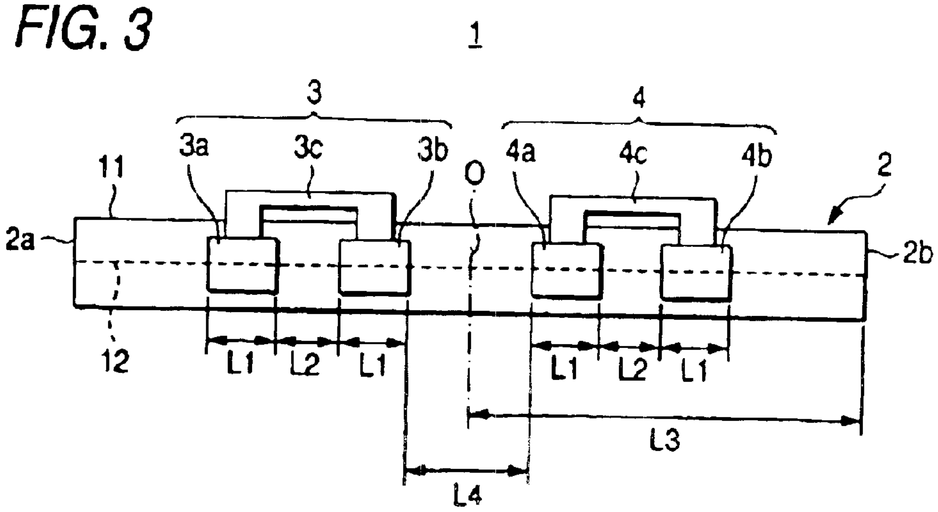
FIG. 3 is a conceptional diagram for explaining a method for using the slug tuner 1.

At the time of matching the impedances using the slug tuner 1, the input side slug 3 and the output side slug 4 are slid with respect to the matching device body 2. At this time, a distance L3 of the output end 2*b* of the matching device body 2 from a center position 0 (as referred to FIG. 3) between the input side slug 3 and the output side slug 4 is adjusted to adjust the phases of the reflected signals which are reflected individually by the two slugs 3 and 4. In this case, the phases of the individual reflected signals by the two slugs 3 and 4 can be likewise adjusted, too, by adjusting the distance of the input end 2*a* of the matching device body 2 from the center position 0 between the two slugs 3 and 4. Moreover, a distance L4 (i.e., the distance between the opposed faces in the invention) between the end face of the slug 3*b* of the input side slug 3 on the side of the output end 2*b* and the end face of the slug 4*a* of the output side slug 4 on the side of the input end 2*a* is adjusted to adjust the amplitude of the reflected signals which are reflected to the side of the input end 2*a* by the output side slug 4. Therefore, the impedances can be completely matched between the amplifier 41 and the antenna 42 by adjusting the position s of the slugs 3*a* and 3*b* (of the input side slug 3) and the slugs 4*a* and 4*b* (of the output side slug 4) suitably in the matching device body 2, to invert the phase of the signal S reflected to the side of the input end 2*a* by the input side slug 3 and the phase of the signal S reflected to the side of the input end 2*a* by the output side slug 4, from each other, and to equalize the amplitude of the signal S reflected to the side of the input end 2*a* by the input side slug 3 and the amplitude of the signal S reflected to the side of the input end 2*a* by the output side slug 4, to each other.

Specifically, the control unit outputs a control signal to drive the motors 22*a* and 22*b*. In this case, the wire ropes 21*a* and 21*b* are turned to slide the input side slug 3 and the output side slug 4 individually in the longitudinal direction of the matching device body 2. At this time, the slugs 3*a* and 3*b* of the input side slug 3 are connected by the connecting fitting 3*c* and fixed on the wire rope 21*a* so that both of them are simultaneously slid as the wire rope 21*a* turns. Moreover, the slugs 4*a* and 4*b* of the output side slug 4 are also connected by the connecting fitting 4*c* and fixed on the wire rope 21*b* so that both of them are simultaneously slid as the wire rope 21*b* turns. Merely by driving the two motors 22*a* and 22*b*, therefore, the four dielectrics of the slugs 3*a*, 3*b*, 4*a* and 4*b* can be moved to adjust the distances L3 and L4 individually. In the slug tuner 1 of this case, the input side slug 3 is provided with the two slugs 3*a* and 3*b*, the opposed faces of which have the distance L2 adjusted to λ/4, so that it reflects the signal S efficiently. Moreover, the output side slug 4 is provided with the two slugs 4*a* and 4*b*, the opposed faces of which have the distance L2 adjusted to λ4, so that it reflects the signal S efficiently like the input side slug 3. As compared with the slug tuner 51, therefore, the slug tuner 1 enlarges the impedance adjustable range sufficiently (i.e., two square times). Therefore, the slug tuner 51 has an impedance matching range of VSWR1 to VSWR10, for example, but the slug tuner 1 of the invention can widen the impedance matching range to VSWR1 to VSWR100.

Thus, this slug tuner 1 is provided with the input side slug 3 having two slugs 3*a* and 3*b* spaced at their opposed faces by λ/4 and the output side slug 4 having the two slugs 4*a* and 4*b* spaced at their opposed faces by λ/4, and is enabled to enlarge the impedance matching range sufficiently by adjusting the two position s of the input side slug 3 and the output side slug 4. By regulating the distances L2 between the slugs 3*a* and 3*b* and between the slugs 4*a* and 4*b* individually to λ/4, the total lengths of the input side slug 3 and the output side slug 4 can be individually shortened, as compared with the construction in which the distance L2 is regulated to 3λ/4, for example, so that the slug tuner 1 can be sufficiently small-sized as a whole.

According to this slug tuner 1, moreover, the slugs 3*a* and 3*b* of the input side slug 3 are connected at the spacing of λ/4 to each other by the connecting fitting 3*c*, and the slugs 4*a* and 4*b* of the output side slug 4 are connected at the spacing of λ/4 to each other by the connecting fitting 4*c*, so that both the slugs 3*a* and 3*b* can be simultaneously slid merely by moving the connecting fitting 3*c* and so that both the slugs 4*a* and 4*b* can be simultaneously slid merely by moving the connecting fitting 4*c*. Although the input side slug 3 and the output side slug 4 are individually provided with the two slugs (or dielectrics), therefore, the position adjustments of the two slugs 3 and 4, that is, the impedance matching performances can be easily done like the slug tuner 51. Unlike the construction in which the four slugs 3*a*, 3*b*, 4*a* and 4*b* are slid separately and independently of one another by four moving mechanisms, the four slugs 3*a*, 3*b*, 4*a* and 4*b* can be slid in this case merely by arranging the two moving mechanisms 5 and 6 so that the manufacturing cost for the slug tuner 1 as a whole can be sufficiently lowered.

Here, the invention should not be limited to the construction exemplified in the embodiment thus far described. In the embodiment of the invention, for example, the distances L2 between the slugs 3*a* and 3*b* and between the slugs 4*a* and 4*b* are individually regulated to λ/4, to which the invention is not limited but which can be adjusted to the various distances satisfying Nλ/4 exactly or substantially. Moreover, the embodiment of the invention has been described, for example, on the slug tuner 1 which is provided with the input side slug 3 having the two slugs 3*a* and 3*b* and the output side slug 4 having the two slugs 4*a* and 4*b*. However, the number of dielectrics (or slugs) constructing the input side dielectric and the output side dielectric individually in the invention should not be limited to that of the embodiment. For example, the input side dielectric and the output side dielectric can be individually constructed to include three or more dielectrics connected to each other at the spacing L, which is equal to $N\lambda/4$ or satisfies $N\lambda/4-\lambda/6\leqq L\leqq N\lambda/4+\lambda/6$. Moreover, the aforementioned embodiment has been described on the construction, in which the input side slug 3 (or the output side slug 4) is slid by the moving mechanism 5 (or the moving mechanism 6) having the wire rope 21*a* (or 21*b*), the motor 22*a* (or 22*b*) and the pulleys 23*a* and 24*a* (or 23*b* and 24*a*). The construction for sliding the input side dielectric and the output side dielectric in the invention should not be limited to that of the embodiment but can also be exemplified by the manually sliding construction as in the slug tuner 51 which has been developed by the common applicant of the invention. Moreover, the moving mechanism in the invention can also be constructed by substituting timing belts, steel belts, V-belts, flat belts and gears (e.g., racks and pinions) for the wire ropes. Moreover, the moving mechanism can also be constructed by using not the belts but ball screws. Furthermore, the connecting fittings 3*c* and 4*c* can be replaced by the an insulating material of a resin to construct the connecting members of the invention. In addition, the embodiment of the invention has been described on the example for matching the impedance between the amplifier 41 and the antenna 42. However, the coaxial type impedance matching device according to the invention should not be limited in its application to that example but can be applied to impedance matching performances between various devices.

According to the coaxial type impedance matching device of the first embodiment of the invention thus far described, the input side dielectric is constructed to include the first dielectric and the second dielectric, which have their opposed faces spaced at the fixed distance exactly or substantially equal to $N\lambda/4$, and the output side dielectric is constructed to include the third dielectric and the fourth dielectric, which have their opposed faces spaced at the fixed distance, so that the impedance matching range can be sufficiently enlarged.

According to the coaxial type impedance matching device of the first embodiment of the invention, moreover, the input side dielectric is constructed by connecting the first and second dielectrics at the predetermined spacing to each other by the connecting member, and the output side dielectric is constructed by connecting the third and fourth dielectrics at the predetermined spacing to each other by the connecting member, so that both the first and second dielectrics (or the third and fourth dielectrics) can be slid merely by moving the individual connecting members. Therefore, the impedance matching performances can be easily done, although the input side dielectric and the output side dielectric are individually provided with the two dielectrics.

Moreover, the coaxial type impedance matching device is provided with the moving mechanisms for moving the connecting members individually so that the impedance matching performances can be easily done by controlling the moving mechanisms. Unlike the construction in which the four dielectrics are slid separately and independently of one another by the four moving mechanisms, the four dielectrics can be slid in this case merely by arranging the two moving mechanisms, i.e., the moving mechanism for the input side dielectric and the moving mechanism for the output side dielectric, so that the manufacturing cost for the coaxial type impedance matching device as a whole can be sufficiently lowered.

According to the coaxial type impedance matching device according to the first embodiment of the invention, moreover, the first and second dielectrics are spaced at the distance exactly or substantially equal to $\lambda/4$, and the third and fourth dielectrics are spaced at the distance exactly or substantially equal to $\lambda/4$. Therefore, the total lengths of the input side slug and the output side slug can be individually shortened, as compared with the construction in which the distance is regulated to $3\lambda/4$, so that the coaxial type impedance matching device can be sufficiently small-sized as a whole.

Second Embodiment

Figure 6:
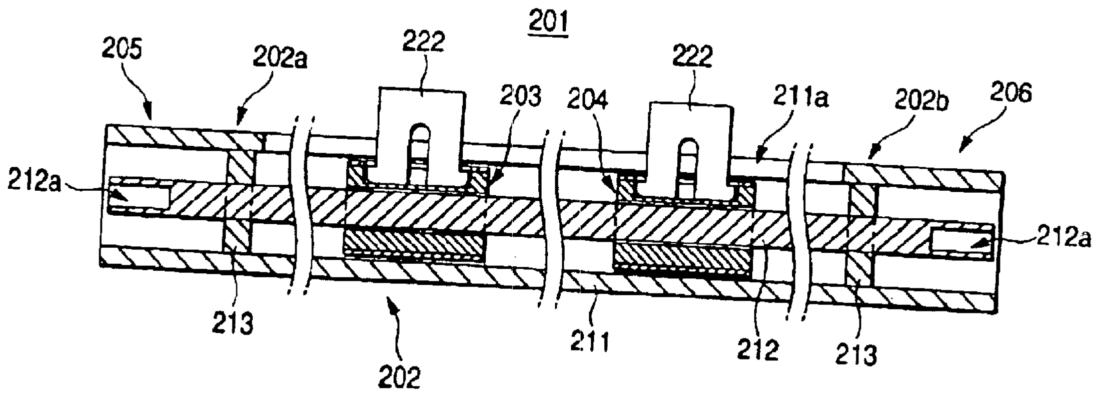
FIG. 6 is a sectional side elevation of a slug tuner 201 according to a second embodiment of the invention.
Figure 7:
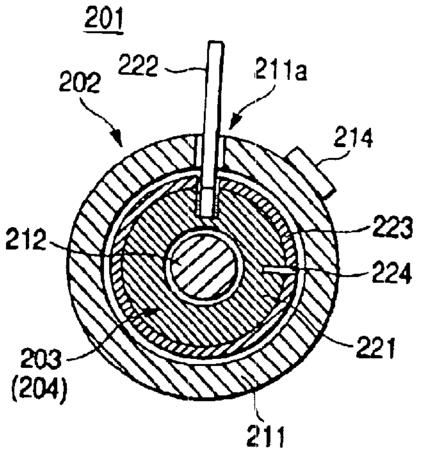
FIG. 7 is a sectional view of the slug tuner 201 in the direction of a cylinder diameter (a diameter).
Figure 8:
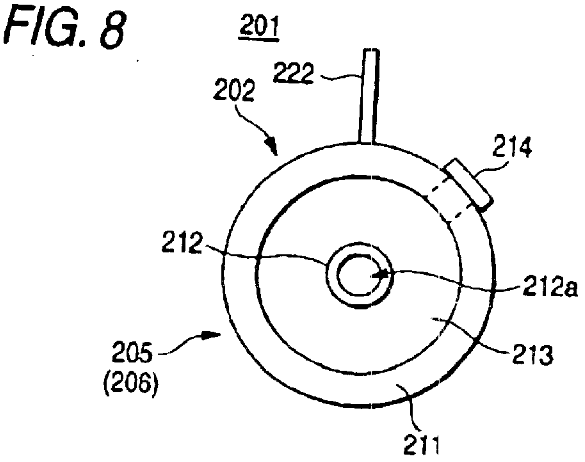
FIG. 8 is a front elevation of the slug tuner 201 taken from the side of a connector unit 205 (206).
Figure 9:
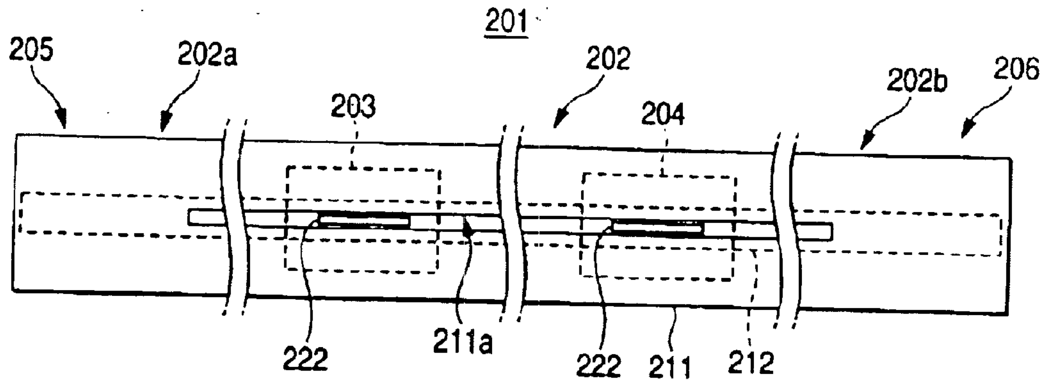
FIG. 9 is a top plan view of the slug tuner 201.

A slug tuner 201, as shown in FIGS. 6 to 8, is an example of the coaxial type impedance matching device according to a second embodiment of the invention and is constructed to include a matching device body 202, an input side slug 203, an output side slug 204 and connector units 205 and 206. This slug tuner 201 is arranged, for example, between an amplifier 241 and an antenna 242, as shown in FIG. 63. By matching the impedances between the amplifier 241 and the antenna 242, a signal S (as exemplified to have a frequency of 2.45 GHz) outputted from the amplifier 241 is substantially completely outputted with little reflection to the antenna 242. As shown in FIGS. 6 and 7, the matching device body 202 is provided with an external conductor 211 of a square-cylinder shape (or tubular shape) having a circular bore formed longitudinally of its center, and a bar-shaped internal conductor 212 housed in the circular bore of the external conductor 211. In this case, as shown in FIG. 6, at the input portion 202*a* and the output portion 202*b* of the matching device body 202, there are arranged dielectrics 213 and 213 (or holding dielectrics in the invention) for holding the internal conductor 212 in the external conductor 211. These dielectrics 213 and 213 are fixed in the external conductor 211 by means of a fixing bolt 214 (see FIGS. 7 and 8).

Figure 10:
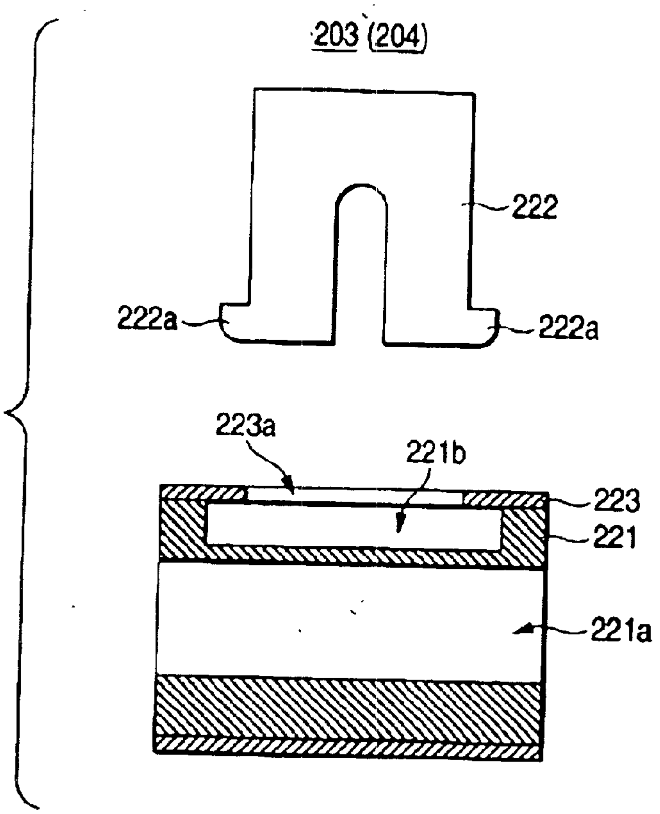
FIG. 10 is a sectional view of an input side slug 203 and an output side slug 204.

In this case, both end portions of the external conductor 211 of the slug tuner 201 construct the external electrodes of the connector units 205 and 206. The external conductor 211 is made long by a length for functioning as the connector units 205 and 206. In the external conductor 211, as shown in FIG. 10, there is formed such a slit 211*a* in the longitudinal direction at a portion to function as the matching device body 202 (i.e., between the input portion 202*a* and the output portion 202*b*) as slides the input slug 203 and the output side slug 204 with the brackets 222 and 222 of the input side slug 203 and the output side slug 204 (as will also be called the "slugs 203 and 204") being protruded to the outside of the external conductor 211. As shown in FIGS. 6 to 8, on the other hand, the internal conductor 212 is formed inserting holes 212*a* and 212*a* to which a center electrode (not shown) of the connector C can be inserted. Both ends of the internal conductor 212 construct center electrodes of the connector units 205 and 206. Also, the internal conductor 212 is held at the center of the circular bore of the external electrode 211 by the dielectrics 213 and 213, which are arranged at the input portion 202*a* and the output portion 203*a* of the matching device body 202, respectively.

The input side slug 203 corresponds to an input side dielectric of the invention, and is provided, as shown in FIG. 10, with a cylindrical dielectric 221 having an inserting hole 212*a* formed at its central portion to which the internal conductor 212 can be inserted, and a bracket 222. (although removed from FIG. 10) fitted in the dielectric 221. In this case, as shown in FIG. 7, a cylindrical collar 223 is so mounted on the dielectric 221 as to cover the circumference of the dielectric 221 and is fixed by a positioning pin 224. In the dielectric 221 and the collar 223, as shown in FIG. 10, there are formed a fitting groove portion 221*b* and a fitting slit 223*a* for fitting the bracket 222. In this case, the fitting slit 223*a* is made shorter at its opening length (or a slit length), as taken in the sliding direction of the input side slug 203, than the fitting groove portion 221*b* of the dielectric 221 and than the length between the two end portions of fitting pawl portions 222*a* and 222*a* formed at the bracket 222. With the collar 223 being mounted on the dielectric 221, therefore, the fitting pawl portions 222*a* and 222*a* are brought into engagement with the back side edge portions of the fitting slit 223*a* by pushing the slotted portion of the bracket 222 to fit the fitting pawl portions 222*a* and 222*a* in the fitting groove portion 221*b*. Therefore, the bracket 222 can be mounted more easily by the single action. Moreover, the bracket 222 is formed of an nonconductive material (e.g., polytetrafluoroethylene) into a thin plate shape and can be elastically deformed. This input side slug 203 is regulated to a thickness, as taken in the sliding direction, in a range of $\lambda/12$ to $5\lambda/12$ (wherein $\lambda$ indicates a guide wavelength of a signal S in the matching device body 202). Preferably, the thickness of the input side slug 203 is equal to $\lambda/4$. The output side slug 204 corresponds to an output side dielectric and is constructed like the input side slug 203.

Figure 11:
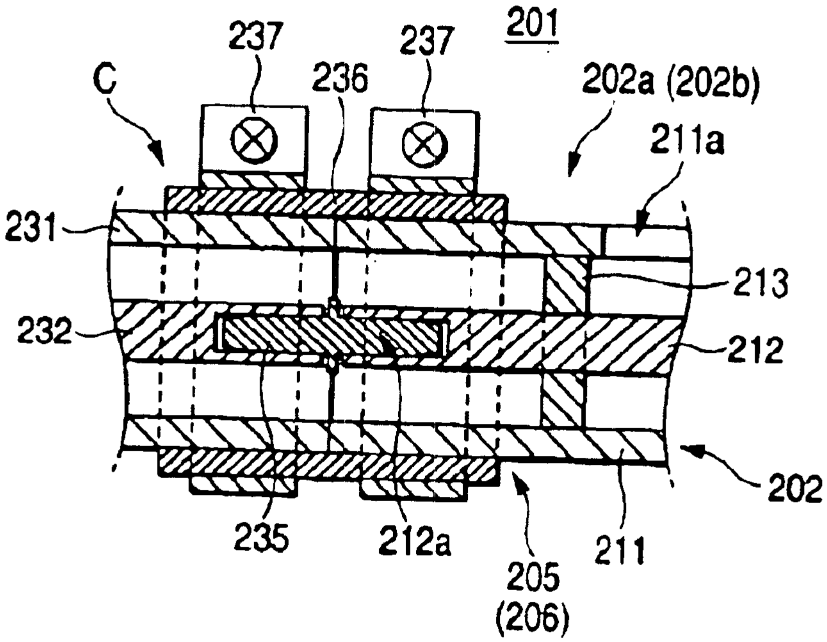
FIG. 11 is a sectional view showing the state in which a connector C is connected to the connector unit 205 (206) in the slug tuner 201 through an inner 235 and an outer 236.
Figure 12:
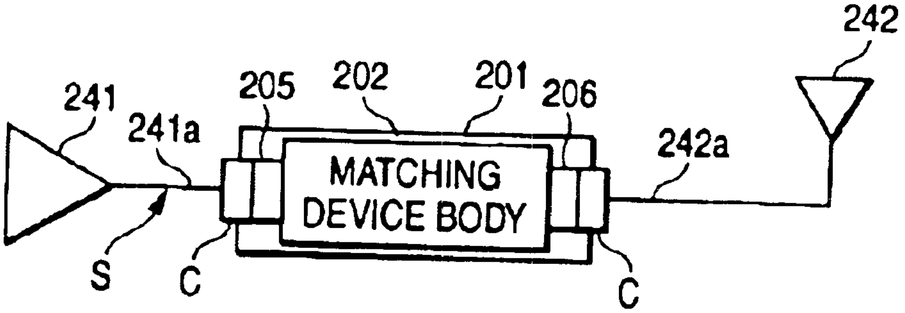
FIG. 12 is a block diagram showing one example of the connected state of the slug tuner 201, an amplifier 241 and an antenna 242.

When the impedance is matched by using this slug tuner 201, as shown in FIG. 12, a connector C of a coaxial cable 241*a* is connected to the connector unit 205, and the connector C of a coaxial cable 242*a* is connected to the connector unit 206. At this time, as shown in FIG. 11, an inner 235, as specified by EIAJ (Electronic Industries Association of Japan), is inserted into an inserting hole 212*a* of the internal conductor 212. Next, there is mounted an outer 236, which is specified by EIAJ for connecting the external electrodes (or the end portions of the external conductor 211) of the connector units 205 and 206 and an external electrode 231 of the connector C. Next, the connectors C are so mounted on the connector units 205 and 206 that the inner 235 mounted in the internal conductor 212 maybe inserted into the inserting hole of a center electrode 232 of the connector C and that the external electrode 231 may be inserted into the outer 236. As a result, the internal conductor 212 of the slug tuner 201 and the center electrode 232 of the connector C are electrically connected through the inner 235. Subsequently, bands 236 and 237 are mounted on the two end portions of the outer 236 to fasten the outer 236. As a result, the external conductor 211 of the slug tuner 201 and the external electrode 231 of the connector C are electrically connected through the outer 236. Thus, the connections of the connectors C and C to the slug tuner 201 are completed.

Subsequently, the input side slug 203 and the output side slug 204 are slid with respect to the matching device body 202 thereby to adjust the distance between the center position between the input side slug 203 and the output side slug 204 and the output portion 202*b* in the matching device body 202. This adjustment adjusts the phases of the individual reflected signals, which are reflected by the two slugs 203 and 204. In this case, by adjusting the distance between the center position between the two slugs 203 and 204 and the input portion 202*a* in the matching device body 202, too, the adjustment can be likewise be made on the phase of the phases of the individual reflected signals, which are reflected by the two slugs 203 and 204. Moreover, the distance between the end face of the input side slug 203 on the side of the output portion 202*b* and the end face of the output side slug 204 on the side of the input portion 202*a* is adjusted to adjust the amplitude of the reflected signal, which is reflected to the side of the input portion 202*a* by the output side slug 204. By suitably adjusting the position s of the input side slug 203 and the output side slug 204 in the matching device body 202, therefore, the phase of the signal S reflected by the input side slug 203 to the side of the input portion 202*a* and the phase of the signal S reflected by the output side slug 204 to the side of the input portion 202*a* are inverted from each other, and the amplitude of the signal S reflected by the input side slug 203 to the side of the input portion 202*a* and the amplitude of the signal S reflected by the output side slug 204 to the side of the input portion 202*a* are equalized to each other, so that the impedance between the amplifier 241 and the antenna 242 can be completely matched. At this time, the slug tuner 201 has the bracket 222 made of the nonconductive material so that a spark between the internal conductor 212 and the bracket 222 can be even when the signal S inputted has a high output.

Thus, according to this slug tuner 201, the external conductor 211 and the internal conductor 212 are made longer than the distance between the input portion 202*a* and the output portion 202*b*, and the connector units 205 and 206 are made integral with the two end portions of the matching device body 202, so that the external electrodes (or the two end portions of the external conductor 211) in the connector units 205 and 206 and the external conductor 211 (or the central portion of the external conductor 211) in the matching device body 202 can be made of an identical conductive member. Therefore, the contact resistance between the external electrode and the external conductor 211 can be eliminated to enhance the according gain equivalently. At the same time, it is possible to lower the costs for the connectors themselves and for mounting the connectors. Moreover, the inserting hole 212*a* for inserting the inner 235 is formed in the internal conductor 212 to construct the center electrode of the connector units 205 and 206, and the external conductor 211 is made to have a length substantially equal to or slightly larger than that of the internal conductor 212 to construct the external electrode of the connector units 205 and 206, so that the connectors C specified by EIAJ can be reliably connected. According to this slug tuner 201, moreover, the internal conductor 212 is held at a predetermined position in the external conductor 211 by the dielectrics 213 and 213 which are arranged at the input portion 202*a* and the output portion 202*b* of the matching device body 202, so that the internal conductor 212 can be held without blocking the sliding movements of the slugs 203 and 204 between the input portion 202*a* and the output portion 202*b*.

According to this slug tuner 201, moreover, the external conductor 211 is formed of a cylindrical member. As compared with the construction in which the external electrodes of the connector units 205 and 206 are made by cutting the two end portions of a square-cylinder member into a circular-cylinder shape, for example, the cutting work can be eliminated to lower the cost for manufacturing the slug tuner 201, sufficiently. Moreover, the slit 211*a* is formed in the external conductor 211 between the input portion 202*a* and the output portion 202*b*. As compared with the structure in which the slit is formed throughout the longitudinal direction of the external conductor 211, therefore, the strength of the two end portions to function as the external electrodes of the connector units 205 and 206 can be improved while allowing the slugs 203 and 204 to slide between the input portion 202*a* and the output portion 202*b*. In this case, the outer 236 is fastened on the two end portions of the external conductor 211 by the bands 237, as has been described. In case the slit 211*a* is formed in that portion, therefore, the external conductor 211 may be deformed. According to this slug tuner 201, however, the slit 211*a* is not formed in the two end portions of the external conductor 211 so that the outer 236 can be fastened with a strong force by the bands 237. As a result, it is possible to connect the external conductor 211 and the outer 236 reliably.

Moreover, the dielectric 221 (i.e., the slug 203 or 204) is provided with the fitting groove portion 221*b* for fitting the bracket 222, and the bracket 222 is provided with the fitting pawl portions 222*a* to be fitted in the fitting groove portion 221*b*. Merely by fitting the fitting pawl portions 222*a* in the fitting groove portion 221*b*, therefore, the bracket 222 can be simply mounted on the dielectric 221 (and the collar 223). Moreover, the bracket 222 is made of the nonconductive material so that the spark between the internal conductor 212 and the bracket 222 can be reliably avoided even when the signal S of a high output is inputted to the slug tuner 201.

Here, the invention should not be limited to the construction thus far described in connection with the embodiment. For example, the second embodiment of the invention has been described on the connector unit 205 or 206 of the type, in which the external conductor 211 and the external electrode 231 are connected by connecting the internal conductor 212 and the center electrode 232 by the inner 235 and by fastening the outer 236 with the bands 237 and 237. The construction of the connector unit in the invention should not be limited to the described one but can also be modified by forming threads on the circumferences of the two end portions of the external conductor 211, for example, so that an M-type connector or an N-type connector may be connected. Moreover, it is quite natural that the connector unit can be arranged not at the two end portions but only at one end portion of the matching device body 202. Moreover, the embodiment of the invention has been described on the example, in which the impedance between the amplifier 241 and the antenna 242 is matched. However, the application of the coaxial type impedance matching device of the second embodiment of the invention should not be limited to the described one but could be extended to impedance matching performances between various devices.

According to the coaxial type impedance matching device of the second embodiment of the invention, as has been described hereinbefore, the external conductor and the internal conductor are made longer than the distance between the signal input portion and the signal output portion, and the connector units are integrally formed on at least one end portion or on the two end portions of the matching device body. As a result, the external electrodes (i.e., the one end portion and the two end portions of the external conductor) in the connector units and the external conductor (or the central portion of the external conductor) in the matching device body can be made of an identical conductive member. Therefore, it is possible to lower the cost and to reduce the contact resistances between the external electrodes and the external conductor. As a result, the gain can be equivalently enhanced.

According to the coaxial type impedance matching device of the second embodiment of the invention, moreover, a center electrode of the connector unit is constructed by forming the inserting hole in the internal conductor for inserting the center electrode of a connection object, and the external conductor is made as long as or longer than the internal conductor to construct the external electrode of the connector unit. Therefore, it is possible to connect the connector, as specified by EIAJ, reliably.

According to the coaxial type impedance matching device of the second embodiment of the invention, moreover, the holding dielectrics are arranged individually at position s corresponding to the signal input portion and the signal output portion of the matching device body, so that the internal conductor is held at a predetermined position in the external conductor. Therefore, the internal conductor can be held without obstructing the sliding movements of the two dielectrics between the signal input portion and the signal output portion.

According to the coaxial type impedance matching device of the second embodiment of the invention, moreover, the external conductor is formed of the cylindrical member. As compared with the construction in which the external electrodes of the connector units are made by cutting the two end portions of a square-cylinder member into a circular-cylinder shape, for example, the cutting work can be eliminated to lower the cost for manufacturing the coaxial type impedance matching device, sufficiently.

According to the coaxial type impedance matching device of the second embodiment of the invention, moreover, the slit for allowing the brackets to slide is opened between the signal input portion and the signal output portion in the external conductor. As compared with the structure in which the slit is formed throughout the longitudinal direction of the external conductor, therefore, the strength of the two end portions to function as the external electrodes of the connector units can be improved while allowing the two dielectrics to slide between the signal input portion and the signal output portion of the two dielectrics. In this case, the outer is fastened on the two end portions of the external conductor by the bands, for example. In the construction, in which the slit is formed in that portion, therefore, the external conductor (or the external electrode) may be deformed. According to this coaxial type impedance matching device, however, the slit is not formed in the two end portions of the external conductor so that the outer can be fastened with a strong force by the bands. As a result, it is possible to connect the external conductor (or the external electrode) and the outer reliably.

According to the coaxial type impedance matching device of the second embodiment of the invention, moreover, the fitting groove portion is formed in the two dielectrics for fitting the bracket, and the bracket is provided with the paired fitting pawl portions to be fitted in the fitting groove portion. Merely by fitting the fitting pawl portions in the fitting groove portion, therefore, the bracket can be easily mounted.

According to the coaxial type impedance matching device of the invention, moreover, the bracket is made of the nonconductive material so that the spark between the internal conductor and the bracket can be reliably avoided even when the signal of a high output is inputted to the coaxial type impedance matching device.

Third Embodiment

Figure 13:
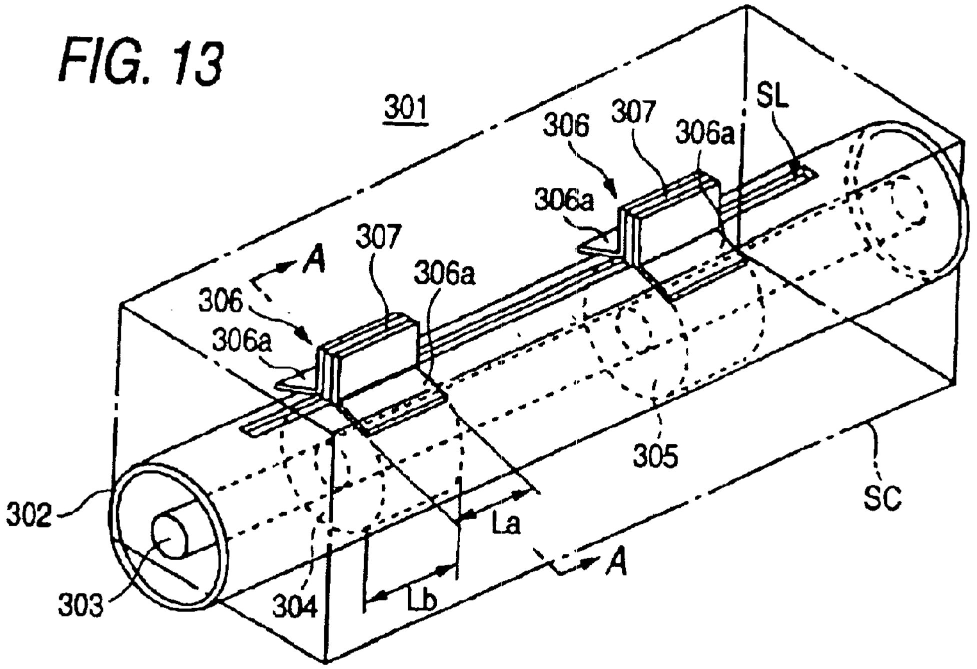
FIG. 13 is a perspective view showing a slug tuner 301 according to a third embodiment of the invention.
Figure 14:
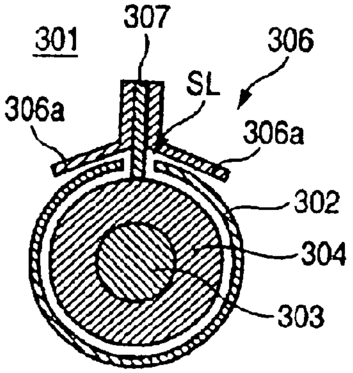
FIG. 14 is a sectional view taken along line A—A of FIG. 13.
Figure 15:
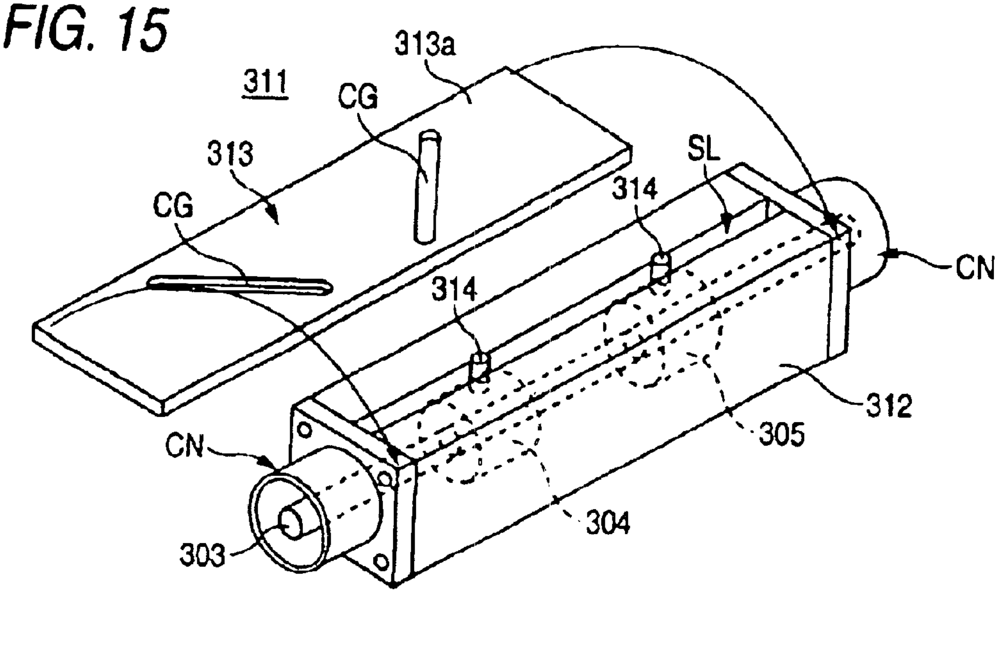
FIG. 15 is an exploded perspective view of a slug tuner 311 according to a fourth embodiment of the invention.

A slug tuner 301, as shown in FIGS. 13 and 14, is an example of the coaxial type impedance matching device according to the third embodiment of the invention and is provided with an external conductor 302, an internal conductor 303, dielectrics (slugs) 304 and 305, and a shielding mechanism 306.

The external conductor 302 is formed, for example, into a tubular shape (or a circular-cylinder shape) having a circular bore formed in the longitudinal direction at its central portion. In the external conductor 302, moreover, one slit SL is formed in the longitudinal direction (or in parallel with axis) for providing the communication between the outside and the inside of the external conductor 302.

The internal conductor 303 is formed into a round bar shape (or a circular-cylinder shape) and is so housed in the circular bore of the external conductor 302 that their axes may be aligned with each other (or coaxially). In this case, the internal conductor 303 constructs a signal transmission line together with the external conductor 302.

The slugs 304 and 305 are formed into a ring shape (or a circular-cylinder shape) having a smaller diameter than the internal diameter of the external conductor 302 and are so housed in the clearance formed between the inner face (or the inner circumference) of the external conductor 302 and the outer face (or the outer circumference) of the internal conductor 303 with the internal conductor 303 being inserted in their central bores that they can move in the longitudinal direction of the internal conductor 303. On the outer faces (or the outer circumferences) of the individual slugs 304 and 305, moreover, there are individually mounted moving brackets 307, which are made of a nonconductive material to construct position changing device. Each moving bracket 307 is formed into a flat plate shape, for example. One end side (the lower end side of FIG. 13) of each moving bracket 307 is connected to the slug 304 or 305. The other end side thereof (the upper end side of FIG. 1) protrudes to the outside of the external conductor 302 through the slit SL. Moreover, each moving bracket 307 is made movable along the slit SL.

As shown in FIGS. 13 and 14, the shielding mechanism 306 is made of a conductive material and is constructed to have a pair of block members **306*a* and 306*a* mounted on the individual slugs 304 and 305. In this case, the individual block members 306*a* and 306*a* are formed, for example, by folding a rectangular flat plate of a sheet metal at its central portion into a dogleg shape. Moreover, the individual block members 306*a* and 306*a* are so individually connected to the other end side of the moving bracket 307 as to form an inverted Y-shape (or an inverted T-shape) as a whole thereby to close the slit SL near the portion where the other end side of the moving bracket 307 is protruded. In this case, it has been confirmed by the experiments conducted by the inventors that a shielding effect (of about 30 dB) substantially identical to that at the time when the slit SL was entirely closed was obtained. Therefore, the block member 6*a* is so regulated that its length La may be equivalent to the length Lb of each slug 304 or 305**.

Thus, according to this slug tuner 301, each slug 304 or 305 housed in the external conductor 302 can be moved from the outside of the external conductor 302 by operating the other end side of the moving bracket manually or by an automatic moving mechanism, so that the impedance, for example, between an amplifier AP and an antenna AN can be matched by changing the characteristic impedance of the signal transmission line from the outside. By mounting the paired block members **306*a* and 306*a* on each slug 304 or 305**, moreover, it is possible to sufficiently reduce the leakage of electromagnetic waves from the slit SL.

Fourth Embodiment

Figure 27:
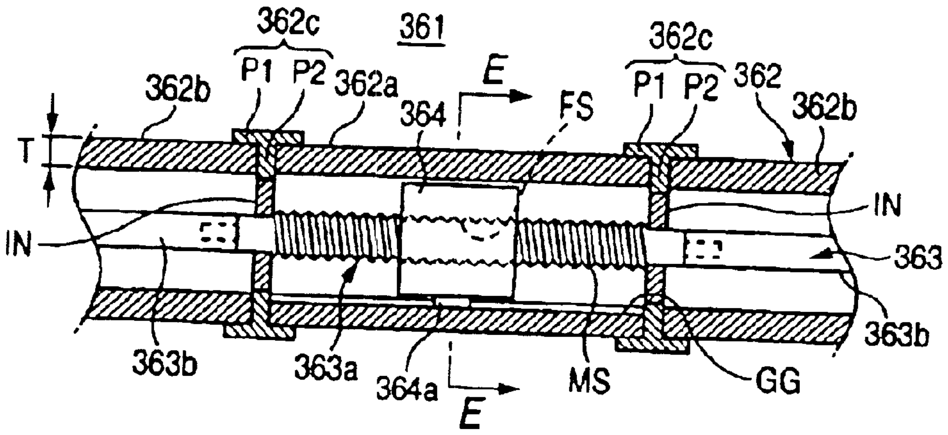
FIG. 27 is a sectional side elevation of the slug tuner 361 and taken on the side of a slug 364.
Figure 28:
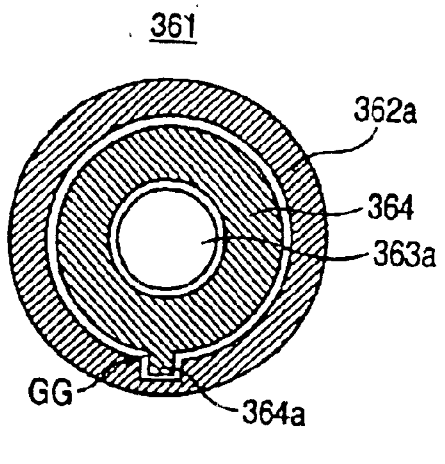
FIG. 28 is a sectional view taken along line E—E of FIG. 27.

A slug tuner 311, as shown in FIGS. 27 and 28, is an example of the coaxial type impedance matching device according to the fourth embodiment of the invention and is provided with an external conductor 312, an internal conductor 303, dielectrics (slugs) 304 and 305, and a shielding mechanism 313. Here, the same components as those of the slug tuner 301 will be omitted on their overlapped description by designating them by the common reference numerals.

The external conductor 312 is formed, for example, into a tubular shape (or a square-cylinder shape) having a circular bore formed in the longitudinal direction at its central portion. In one (as exemplified by an upper side wall in FIG. 27 in this embodiment) of the four side walls of the external conductor 312, moreover, one slit SL is formed in the longitudinal direction (or in parallel with axis) for providing the communication between the outside and the inside of the external conductor 312. Here, connector units CN and CN are attached to the two end portions of the external conductor 312.

The internal conductor 303 is formed into a round bar shape and is so housed in the circular bore of the external conductor 312 that their axes may be aligned with each other. The slugs 304 and 305 are housed movably in the clearance formed between the inner face (or the inner circumference) of the external conductor 312 and the outer face of the internal conductor 303 with the internal conductor 303 being inserted in their central bores. On the outer faces of the individual slugs 304 and 305, moreover, there are individually mounted moving brackets 314, which are made of a nonconductive material to construct the position changing device. In this case, each moving bracket 314 is formed into a circular column shape, for example, and is connected on its one end side (or on the lower end side of FIG. 27) to the slug 304 or 305 and protruded at its other end side (or on the upper end side of FIG. 27) to the outside of the external conductor 312 through the slit SL.

Figure 16:
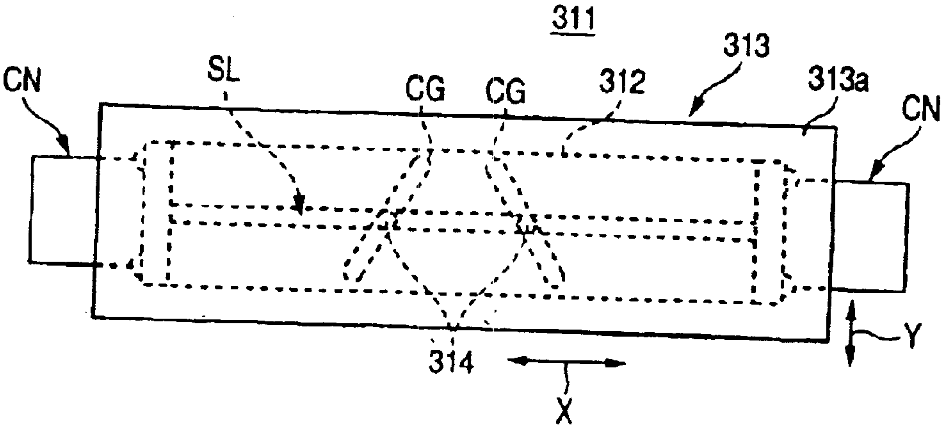
FIG. 16 is a top plan view of the slug tuner 311.

As shown in FIG. 27, the shielding mechanism 313 is composed of a block member **313*a*, which is formed into a plate shape (or a rectangular flat plate) having a length capable of blocking the slit SL as a whole. This block member 313*a* has two cam grooves CG and CG formed in its one face side to construct the position changing device together with the moving brackets 314, and is so arranged at the portions forming the slit SL as to move relative to the external conductor 312. Moreover, the individual cam grooves CG and CG are formed to have a width to fit the other end sides of the individual moving brackets 314 and in directions to intersect the longitudinal direction of the internal conductor 303 obliquely, and are arranged to have an entire shape of Japanese letter "ハ" As shown in FIG. 27, the block member 313*a* is placed on the side wall, as having the slit SL, of the external conductor 312 with its face having the cam grooves CG and CG being directed toward the slit SL. In this state, the slit SL is wholly blocked by the block member 313*a*. Moreover, the other end sides of the moving brackets 314 mounted on the slugs 304 and 305 are fitted in the corresponding cam grooves CG and CG, as shown in FIG. 16. Thus, the block member 313*a*, as placed on the side wall of the external conductor 312, is connected to the not-shown X-Y driving mechanism (or moving mechanism), by which it can be moved individually in the X- and Y-directions of FIG. 16**.

When the impedance is to be matched by using this slug tuner 311, the block member **313*a* is moved individually in the X- and Y-directions by controlling the X-Y driving mechanism. When the block member 313*a* is then moved in the Y-direction relative to the external conductor 312, the intersecting position s between the cam grooves CG and CG and the slit SL are changed so that the individual moving brackets 314 and 314 are moved in the opposite directions of each other while being guided by the individual cam grooves CG and CG. As a result, the slugs 304 and 305 are also moved in the opposite directions in the external conductor 312 so that their distance is changed. In case the block member 313***a* is moved in the X-direction relative to the external conductor 312, on the other hand, the individual moving brackets 314 and 314 are moved simultaneously in the same direction in the slit SL while being guided by the individual cam grooves CG and CG. As a result, the individual slugs 304 and 305 are moved in the same direction in the external conductor 312. By controlling the X-Y driving mechanism to move the block member 313*a* in the X- and Y-directions, therefore, the individual slugs 304 and 305 are moved to arbitrary position s in the external conductor 312 thereby to match the impedance.

Thus, according to this slug tuner 311, the individual slugs 304 and 305 can be moved to arbitrary position s in the external conductor 312 through the individual moving brackets 314 and 314 by moving the block member 313*a*. In short, the impedance matching performance can be done from the outside of the external conductor 312. Moreover, the slit SL is blocked at all times by the block member 313*a* so that the leakage of the electromagnetic waves from the slit SL can be sufficiently prevented.

Fifth Embodiment

Figure 17:
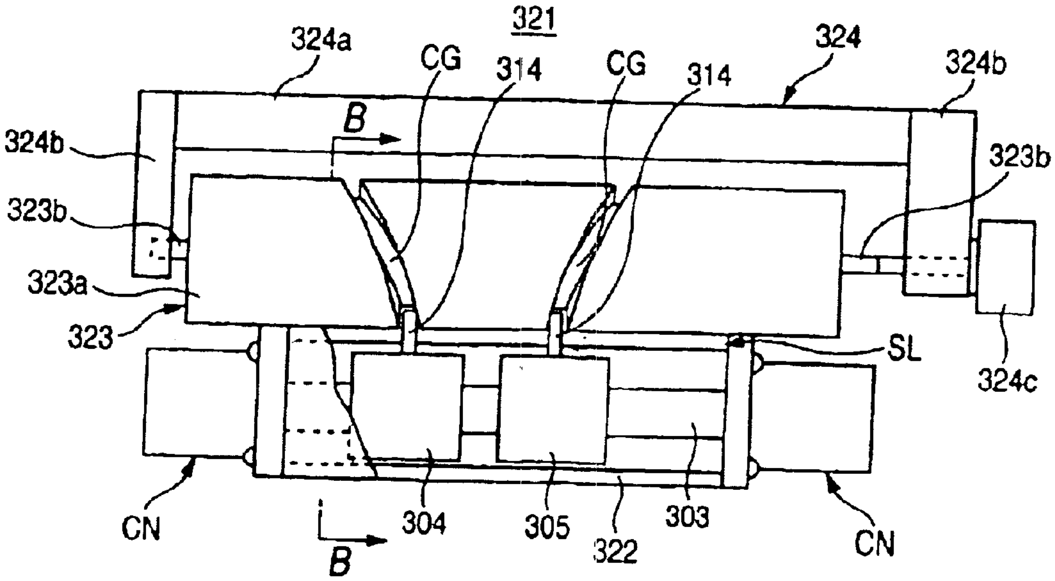
FIG. 17 is a partially cut-away side elevation of a slug tuner 321 according to a fifth embodiment of the invention.
Figure 18:
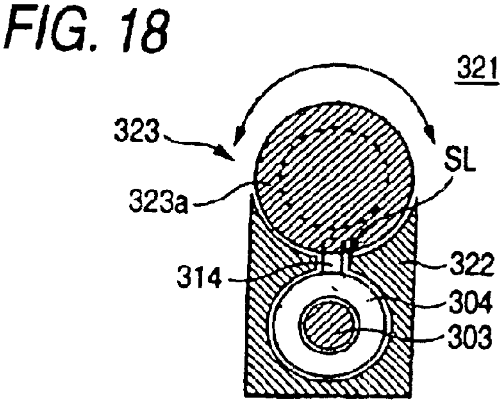
FIG. 18 is a sectional view taken along line B—B of FIG. 17.

A slug tuner 321, as shown in FIGS. 17 and 18, is an example of the coaxial type impedance matching device according to a fifth embodiment of the invention and is provided with an external conductor 3322, an internal conductor 303, dielectrics (or slugs) 304 and 305, and a shielding mechanism 323. Here, the same components as those of the slug tuner 301 will be omitted on their overlapped description by designating them by the common reference numerals.

The external conductor 3322 is formed, for example, into a tubular shape (or a square-cylinder shape) having a circular bore formed in the longitudinal direction at its central portion. One (as exemplified by an upper side wall in FIGS. 17 and 18 in this embodiment) of the four side walls of the external conductor 3322 is formed into such a gutter shape as is sectionally recessed arcuately inward in its surface. In the central portion of that upper side wall, moreover, there is formed one slit SL, which is extended in the longitudinal direction (or in parallel with axis) for providing the communication between the outside and the inside of the external conductor 3322. Here, connector units CN and CN are attached to the two end portions of the external conductor 3322.

The internal conductor 303 is formed into a round bar shape and is so housed in the circular bore of the external conductor 3322 that their axes may be aligned with each other. The slugs 304 and 305 are housed movably in the clearance formed between the inner face (or the inner circumference) of the external conductor 3322 and the outer face of the internal conductor 303 with the internal conductor 303 being inserted in their central bores. On the outer faces of the individual slugs 304 and 305, moreover, there are individually mounted moving brackets 314 and 314, which construct the position changing device. These moving brackets 314 and 314 are formed into a circular-cylinder shape, for example, and are connected on their one end side to the slug 304 and 305 and protruded at their other end side to the outside of the external conductor 3322 through the slit SL.

Figure 29:
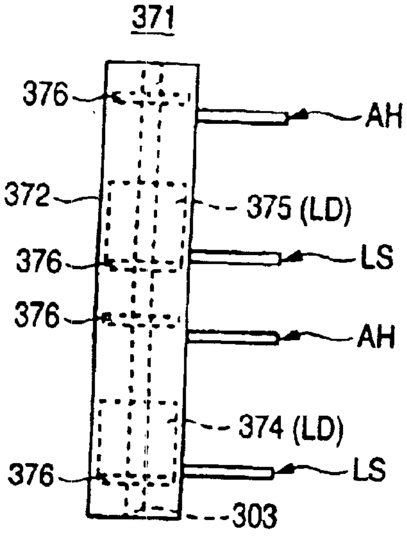
FIG. 29 is a front elevation of a slug tuner 371 according to a tenth embodiment of the invention.

As shown in FIGS. 17 and 18, the shielding mechanism 323 is composed of a block member 323*a*, which is formed into a circular column shape (or a circular-cylindrical shape) having a length capable of blocking the slit SL as a whole. In this case, the block member 323*a* has cam grooves CG and CG formed in its outer face (or its outer circumference) to construct the position changing device together with the moving brackets 314. For example, the individual cam grooves CG and CG are formed in directions to intersect the longitudinal direction of the internal conductor 303 obliquely, so that the intersecting position s between the individual cam grooves CG and CG and the slit SL are changed when the block member 323*a* turns. Moreover, the block member 323*a* is arranged in parallel with and turnably relative to the external conductor 3322 in the gutter-shaped side wall, in which the slit SL is formed, of the external conductor 3322 so that it blocks the slit SL. In this state, the individual moving brackets 314 and 314 are fitted at their individual other end sides in the corresponding cam grooves CG and CG. As shown in FIG. 29, moreover, the block member 323*a* is turnably supported by a moving mechanism 324 at its support shafts 323*b* and 323*b* protruded along the axis from its two end faces.

As shown in FIG. 29, the moving mechanism 324 is provided with: a base arm 324*a* arranged in a horizontal position; a pair of support arms 324*b* and 324*b* extending downward from the two ends of the base arm 324*a* for supporting the support shafts 323*b* and 323*b* of the block member 323*a* turnably therebetween; a motor 324*c* mounted on one support arm 324*b* and having its output shaft connected to the support shaft 323*b* of the block member 323*a* for driving the block member 323*a* rotationally; and the not-shown drive mechanism for moving the base arm 324*a* in parallel in the longitudinal direction of the internal conductor 303.

When the impedance is to be matched by using this slug tuner 321, the moving mechanism 324 is controlled to turn the block member 323*a* or move it in the longitudinal direction of the internal conductor 303. When the block member 323*a* is turned in this case, the individual moving brackets 314 and 314 are moved independently of each other along the slit SL while being guided by the individual cam grooves CG and CG. As a result, the distance between the individual slugs 304 and 305 in the external conductor 3322 is changed. When the block member 323*a* is moved in the longitudinal direction of the internal conductor 303, on the other hand, the individual moving brackets 314 and 314 are simultaneously moved in the same direction in the slit SL while being guided by the individual cam grooves CG and CG. As a result, the distances of the individual slugs 304 and 305 from the end portions of the external conductor 3322 are changed. By controlling the moving mechanism 324 to turn the block member 323*a* or move it in the longitudinal direction of the internal conductor 303, therefore, the individual slugs 304 and 305 are moved in the longitudinal direction of the internal conductor 303 to arbitrary position sin the external conductor 3322 thereby to perform the impedance.

Thus, according to this slug tuner 321, the individual slugs 304 and 305 can be moved from the outside of the external conductor 3322 to arbitrary position s through the individual moving brackets 314 and 314 by moving the block member 323*a*. In short, the impedance matching performance can be done from the outside. Moreover, the slit SL is blocked at all times by the block member 323*a* so that the leakage of the electromagnetic waves from the slit SL can be sufficiently prevented.

Sixth Embodiment

Figure 19:
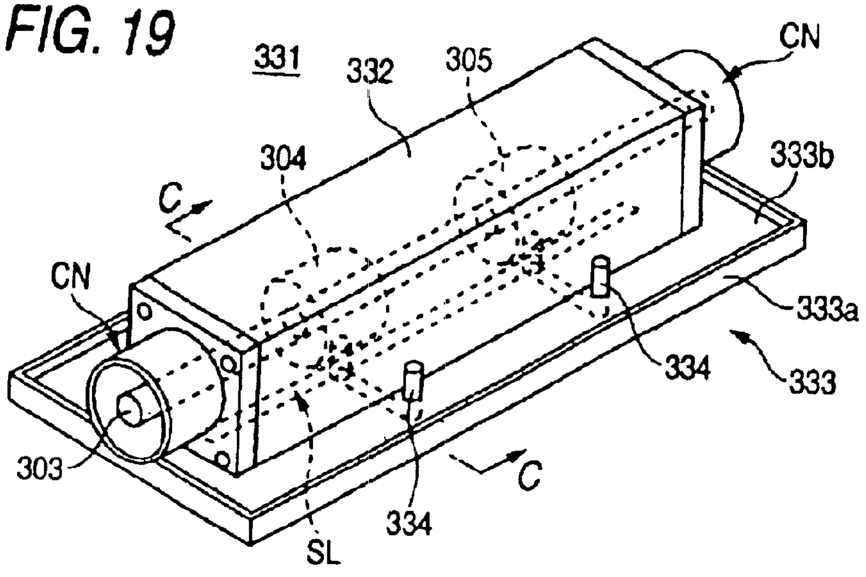
FIG. 19 is a perspective view of a slug tuner 331 according to a sixth embodiment of the invention.
Figure 20:
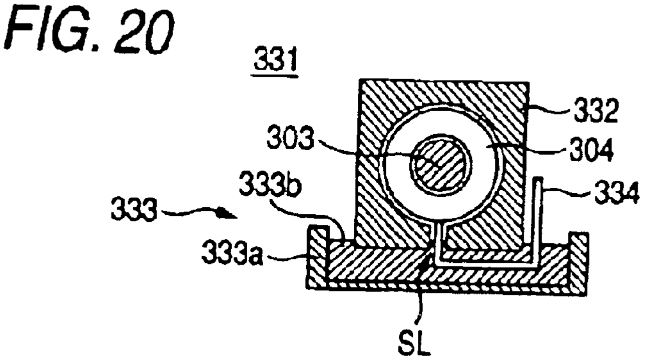
FIG. 20 is a sectional view taken along line C—C of FIG. 19.

A slug tuner 331, as shown in FIGS. 19 and 20, is an example of the coaxial type impedance matching device according to the invention and is provided with an external conductor 332, an internal conductor 303, dielectrics (or slugs) 304 and 305, and a shielding mechanism 333. Here, the same components as those of the slug tuner 301 will be omitted on their overlapped description by designating them by the common reference numerals.

The external conductor 332 is formed, for example, into a tubular shape (or a square-cylinder shape) having a circular bore formed in the longitudinal direction at its central portion. In one (as exemplified by a lower side wall in FIGS. 19 and 20) of the four sidewalls of the external conductor 332, moreover, one slit SL is formed in the longitudinal direction (or in parallel with axis) for providing the communication between the outside and the inside of the external conductor 332. Here, connector units CN are attached to the two end portions of the external conductor 332.

The internal conductor 303 is formed into a round bar shape and is so housed in the circular bore of the external conductor 332 that their axes may be aligned with each other. The slugs 304 and 305 are housed movably in the clearance formed between the inner face (or the inner circumference) of the external conductor 332 and the outer face of the internal conductor 303 with the internal conductor 303 being inserted in their central bores. On the outer faces of the individual slugs 304 and 305, moreover, there are individually mounted moving brackets 334, which construct the position changing device. In this case, these moving brackets 334 and 334 are made of a nonconductive material and formed into a C-shape as a whole by having their one end side connected to the slug 304 and 305 and their other end side protruded to the outside of the external conductor 332 through the slit SL and extended along the lower side wall having the slit SL and along the other side wall (the righthand side wall in FIG. 20) contacting with that lower side wall.

The shielding mechanism 333 is constructed to have a dish member 333*a* reserved with a liquid metal (e.g., mercury) having conductivity, as shown in FIGS. 19 and 20. The external conductor 332 is so arranged in the dish member 333*a* with its portion having the slit SL being directed downward that the lower side wall having the slit SL is partially dipped in the liquid metal 333*b*. As a result, the liquid metal 333*b* advances to the entirety of the slit SL so that the slit SL is blocked by the liquid metal 333*b*. Moreover, the individual C-shaped moving brackets 334 and 334 are buried on their one end side in the liquid metal 333*b* and protruded (or exposed) on their other end side from the surface of the liquid metal 333*b*.

When the impedance is to be matched by using this slug tuner 331, the other ends of the individual moving brackets 334 and 334 protruded from the surface of the liquid metal 333*b* are operated to move the individual slugs 304 and 305 in the longitudinal direction of the internal conductor 303. As a result, the distance between the slugs 304 and 305 and the distances of the individual slugs 304 and 305 from the end portions of the external conductor 332 are changed to do the impedance matching performance.

Thus, according to this slug tuner 331, the individual slugs 304 and 305 can be moved from the outside of the external conductor 332 to arbitrary position s through the individual moving brackets 334 and 334. In short, the impedance matching performance can be done from the outside. Moreover, the slit SL is blocked at all times by the liquid metal 333*b* constructing the shielding mechanism 333 so that the leakage of the electromagnetic waves from the slit SL can be sufficiently prevented.

Seventh Embodiment

Figure 21:
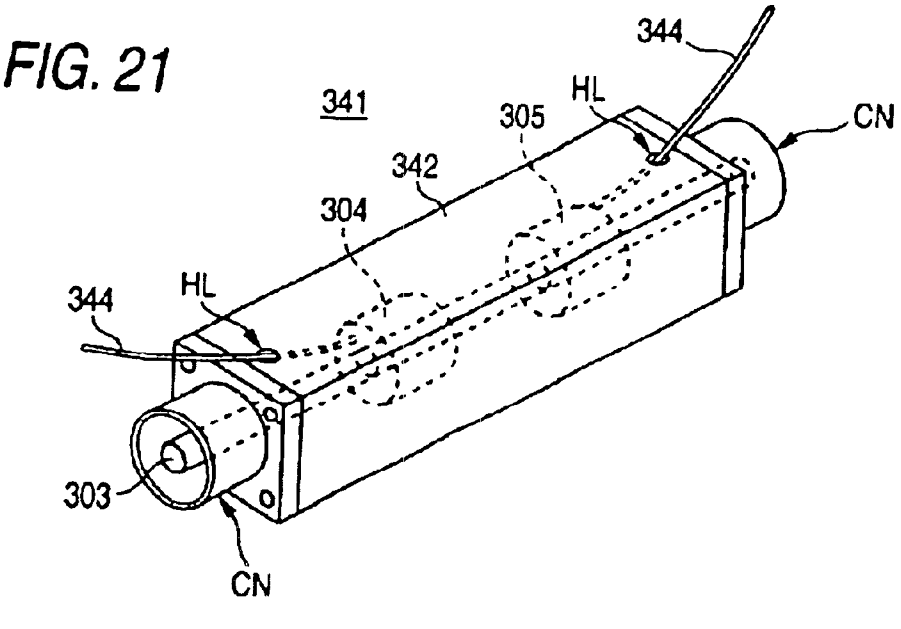
FIG. 21 is a perspective view of a slug tuner 341 according to a seventh embodiment of the invention.
Figure 22:
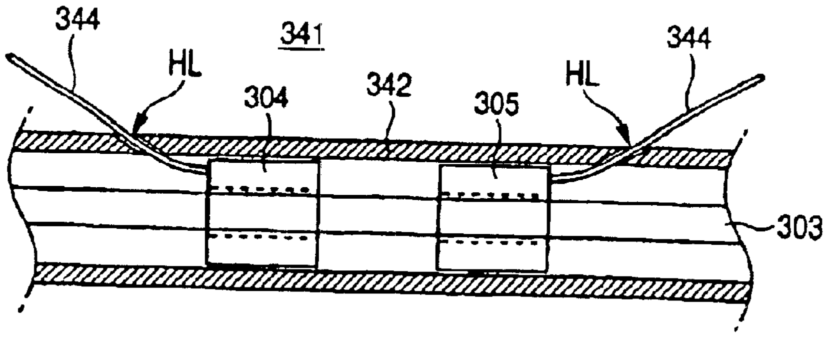
FIG. 22 is a sectional side elevation of the slug tuner 341.

A slug tuner 341, as shown in FIGS. 21 and 22, is an example of the coaxial type impedance matching device according to a seventh embodiment of the invention and is provided with an external conductor 342, an internal conductor 303 and dielectrics (slugs) 304 and 305. Here, the same components as those of the slug tuner 301 will be omitted on their overlapped description by designating them by the common reference numerals.

The external conductor 342 is formed, for example, into a tubular shape (or a square-cylinder shape) having a circular bore formed in the longitudinal direction at its central portion. In one (as exemplified by an upper side wall in FIGS. 21 and 22) of the four side walls of the external conductor 342, moreover, one through hole HL is formed near each of their end portions for providing the communication across (or between the outside and the inside of) the external conductor 342. Here in this slug tuner 341, the side wall, in which the through holes HL are formed, of the external conductor 342 construct the shielding mechanism. Moreover, connector units CN are attached to the two end portions of the external conductor 342.

The internal conductor 303 is formed into a round bar shape and is so housed in the circular bore of the external conductor 342 that their axes may be aligned with each other. In this case, the slugs 304 and 305 are housed movably in the clearance formed between the inner face (or the inner circumference) of the external conductor 332 and the outer face of the internal conductor 303 with the internal conductor 303 being inserted in their central bores. Into the individual through holes HL, moreover, there are individually slidably inserted rods 344, which construct the position changing device, as shown in FIGS. 21 and 22. Here, the leading ends, as inserted, of the individual rods 344 are connected to the side faces of the corresponding slugs 304 and 305 on the side of the connector units CN. Moreover, the individual rods 344 are made long of a nonconductive material having a rigidity and a flexibility.

When the impedance is to be matched by using this slug tuner 341, the one side ends of the individual moving brackets 44 and 44 are operated to move the individual slugs 304 and 305 in the longitudinal direction of the internal conductor 303. As a result, the distance between the slugs 304 and 305 and the distances of the individual slugs 304 and 305 from the end portions of the external conductor 342 are changed to do the impedance matching performance.

Thus, according to this slug tuner 341, the slit SL is replaced by the two through holes HL formed in the external conductor 342, and the rods 344 are individually inserted into those through holes 42 to make the individual slugs 304 and 305 movable. Therefore, the effective area in the external conductor 342 can be made drastically smaller than that of the construction having the slit SL, while making it possible to adjust the position s of the individual slugs 304 and 305 from the outside. As a result, it is possible to reduce the electromagnetic waves, as might otherwise leak to the outside of the external conductor 342, drastically.

Eighth Embodiment

Figure 23:
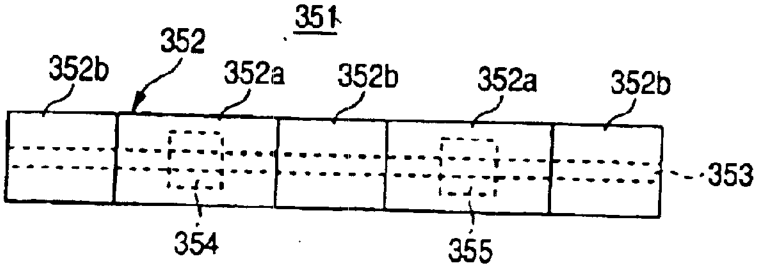
FIG. 23 is a side elevation of a slug tuner 351 according to an eighth embodiment of the invention.

A slug tuner 351, as shown in FIG. 23, is an example of the coaxial type impedance matching device according to an eighth embodiment of the invention and is provided with an external conductor 352, an internal conductor 353 and dielectrics (slugs) 354 and 355. Here in the slug tuner 351, the individual slugs 354 and 355 have identical constructions. In the following, therefore, the construction on the side of the slug 354 will be described, but the description of the construction on the side of the slug 355 will be omitted.

Figure 24:
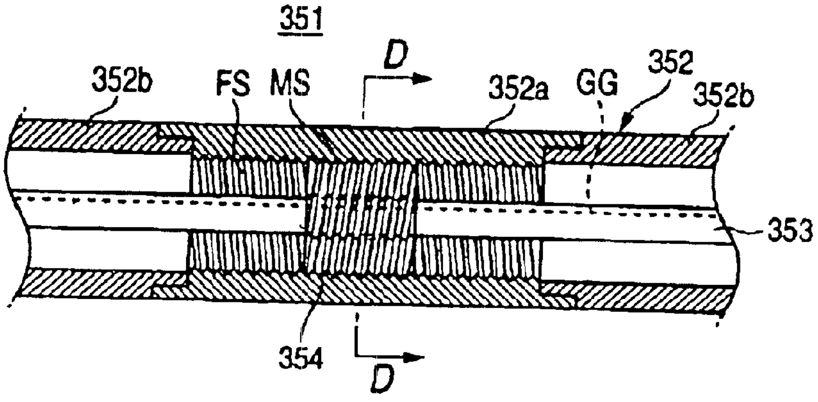
FIG. 24 is a sectional side elevation of the slug tuner 351 and taken on the side of a slug 354.
Figure 25:
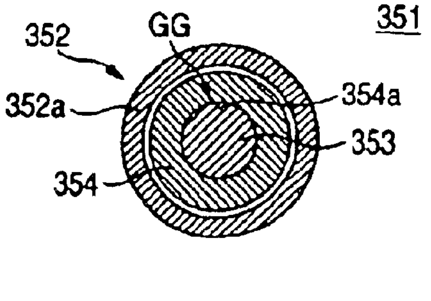
FIG. 25 is a sectional view taken along line D—D of FIG. 24.

The external conductor 352 is formed as a whole into a cylindrical shape having a circular bore formed in the longitudinal direction at its central portion, as shown in FIG. 24, and is provided with an intermediate external conductor 352*a* having a female screw portion FS formed in its inner face (the inner circumference), and a pair of end external conductors 352*b* and 352*b* arranged across the intermediate external conductor 352*a* for supporting the intermediate external conductor 352*a* turnably. In this case, the intermediate external conductor 352*a* functions as the shielding mechanism. For example, the intermediate external conductor 352*a* has an internal diameter made slightly larger at its two ends than that at the remaining portion. On the other hand, the paired end external conductors 352*b* and 352*b* have an outer diameter made slightly smaller at their end portions on the side of the intermediate external conductor 352*a* than the internal diameter of the two end portions of the intermediate external conductor 352*a*. The intermediate external conductor 352*a* and the paired end external conductors 352*b* and 352*b* thus constructed are connected to each other by inserting the aforementioned individual end portions of the paired end external conductors 352*b* and 352*b* individually into the two end portions of the intermediate external conductor 352*a*. By these constructions, moreover, the intermediate external conductor 352*a* is turnably supported between the paired end external conductors 352*b* and 352*b*.

The internal conductor 353 is formed into a round bar shape (a circular-column shape) and is so housed in the circular bore of the external conductor 352 that their axes maybe aligned with each other. In the outer face (the outer circumference) of the internal conductor 353, moreover, a guide groove GG is formed in parallel with the axial direction to construct a portion of a turn regulating mechanism. This internal conductor 353 is so supported at its two end portions by the not-shown dielectrics arranged in the paired end external conductors 352*b* and 352*b* that it cannot turn relative to the paired end external conductors 352*b* and 352*b*, thereby to construct the signal transmission line together with the external conductor 352.

The slug 354 is formed into a ring shape (or a circular-cylinder shape) having an male threaded portion MS formed on its outer face (or its outer circumference), and is housed while being threaded in the intermediate external conductor 352*a*. On the inner face (or the inner circumference) of the central bore of the slug 354, moreover, there is formed a protrusion 354*a*, which constructs the turn regulating mechanism together with the guide groove GG. In this case, the internal conductor 353 is so inserted into the central bore of the slug 354 that the protrusion 354*a* is fitted in the guide groove GG. Moreover, the turn regulating mechanism, as constructed of the guide groove GG and the protrusion 354*a*, regulates the turns of the slug 354 relative to the internal conductor 353 while allowing the movement of the slug 354 in the longitudinal direction of the internal conductor 353.

When the impedance is to be matched by using that slug tuner 351, the intermediate external conductor 352*a* on the side of the slug 354 (or 355) to be position-changed is turned. At this time, the slug 354 (or 355), as housed while being threaded in the intermediate external conductor 352*a*, is regulated from its turns by the turn regulating mechanism formed between its inner face and the outer face of the internal conductor 353, so that it turns relatively in the direction opposite to the turning direction of the intermediate external conductor 352*a*. As a result, the slug 354 (or 355) is moved inside of the intermediate external conductor 352*a* in the longitudinal direction of the internal conductor 353. Therefore, the distance of the slug 354 (or 355) from the end portion of the external conductor 352 is changed to match the impedance. Thus in this slug tuner 351, the position changing device for changing the position with respect to the individual slugs 354 and 355 is constructed of: the intermediate external conductors 52*a* and 52*a* supported turnably between the paired end external conductors 352*b* and 352*b* for threading the slugs 354 and 355 therein; the internal conductor 353 inserted into the central bores of the slugs 354 and 355; and the turn regulating mechanism.

Thus, according to this slug tuner 351, the slugs 354 and 355 are so constructed by making them movable from the outside of the external conductor 352 that an opening such as the slit SL can be avoided from being formed in the external conductor 352, while allowing the impedance to be matched from the outside. Therefore, it is possible to reduce the leakage of the electromagnetic waves drastically from the external conductor 352.

Ninth Embodiment

Figure 26:
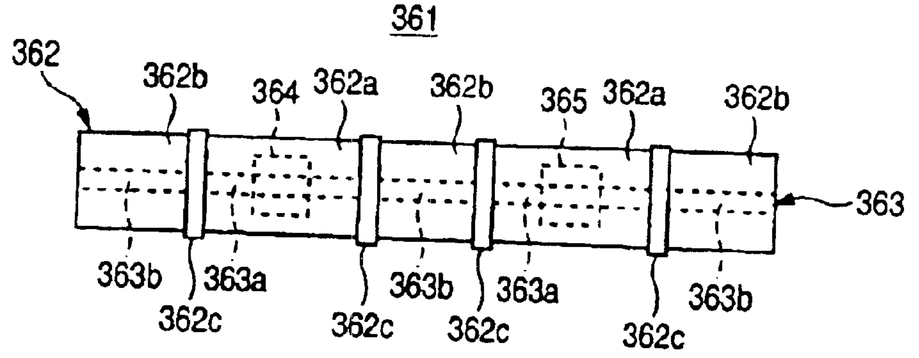
FIG. 26 is a side elevation of a slug tuner 361 according to a ninth embodiment of the invention.

A slug tuner 361, as shown in FIG. 26, is an example of the coaxial type impedance matching device according to a ninth embodiment of the invention and is provided with an external conductor 362, an internal conductor 363 and dielectrics (or slugs) 364 and 365. Here in the slug tuner 361, the individual slugs 364 and 365 have identical constructions. In the following, therefore, the construction on the side of the slug 364 will be described, but the description of the construction on the side of the slug 365 will be omitted.

The external conductor 362 is provided, as shown in FIG. 27, with: an intermediate external conductor 362*a*; a pair of end external conductors 362*b* and 362*b* arranged across the intermediate external conductor 362*a*; and a pair of ring-shaped external conductors 362*c* and 362*c* individually arranged slidably between the intermediate external conductor 362*a* and the individual external conductors 362*b* and 362*b*, and is formed as a whole into a cylindrical shape having a circular bore formed in the longitudinal direction at its central portion. In this case, the intermediate external conductor 362*a* functions as the shielding mechanism. As an example, moreover, the intermediate external conductor 362*a* and the paired end external conductors 362*b* and 362*b* are individually formed to have an equal internal diameter and an equal outer diameter. On the other hand, the ring-shaped external conductor 362*c* is constructed to include a cylindrical portion P1 having an internal diameter slightly larger than the outer diameter of the intermediate external conductor 362*a* and the outer diameter of the paired end external conductors 362*b* and 362*b*, and an annular portion P2 extended with an equal width in the axial direction from the central portion of the inner face (or the inner circumference) of the cylindrical portion P1. In this case, the extending width of the annular portion P2 is set substantially equal to the thickness T of the intermediate external conductor 362*a* and the paired end external conductors 362*b* and 362*b*. Moreover, the intermediate external conductor 362*a* and the paired end external conductors 362*b* and 362*b* are coaxially connected to each other by fitting the ring-shaped external conductors 362*c* and 362*c* individually on the two end portions of the intermediate external conductor 362*a* and by fitting the individual end portions of the end external conductors 362*b* and 362*b* individually in the ring-shaped external conductors 362*c* and 362*c*. Moreover, a guide groove GG to form a portion of the turn regulating mechanism is formed in the inner face (e.g., in the lower portion of the inner face (or the inner circumference) of the intermediate external conductor 362*a* and in parallel with the axial direction. Moreover, the intermediate external conductor 362*a* and the paired end external conductors 362*b* and 362*b* are individually supported unturnably by the not-shown support mechanism. On the other hand, the individual ring-shaped external conductors 362*c* and 362*c* are not supported by such support mechanism. Therefore, the individual ring-shaped external conductors 362*c* and 362*c* are made turnable relative to the intermediate external conductor 362*a* and the paired end external conductors 362*b* and 362*b*.

The internal conductor 363 is provided with an intermediate internal conductor 363*a* having an male threaded portion MS on its outer face (or its outer circumference), and a pair of end internal conductors 363*b* and 363*b* arranged across the intermediate internal conductor 363*a* for supporting the intermediate internal conductor 363*a* turnably. For example, the two end faces of the intermediate internal conductor 363*a* have projections formed to have a circular column shape. The intermediate internal conductor 363*a* is turnably supported between the paired end internal conductors 363*b* and 363*b* by inserting the column-shaped projections into the circular holes, which are formed in the end faces of the individual end internal conductors 363*b* and 363*b* on the side of the intermediate internal conductor 363*a*. Moreover, the internal conductor 363 is so housed in the circular bore of the external conductor 362 that their axes may be aligned with each other. Moreover, disc-shaped insulating plates IN are fixedly connected to the outer faces of the individual end portions of the intermediate internal conductor 363*a*, and the inner faces of the annular portions, as corresponding to the individual insulating plates IN, of the ring-shaped external conductors 362*c* are also fixedly connected to the outer faces of the individual end portions of the intermediate internal conductor 363*a*. Therefore, the intermediate internal conductor 363*a*, the individual insulating plates IN and IN, and the individual ring-shaped external conductors 362*c* and 362*c* are integrally connected to each other. In this case, the internal conductor 363 constructs the signal transmission line together with the external conductor 362.

The slug 364 is formed into the ring shape (or the circular-cylinder shape) and has a female screw portion FS formed in the inner face (or the inner circumference) of its central bore. Moreover, the slug 364 is inserted with the center internal conductor 363*a* being fastened in its central bore, and is housed in this state in the intermediate external conductor 362*a*. As shown in FIGS. 27 and 28, moreover, the slug 364 has such a protrusion 364*a* formed on its outer face (or its outer circumference) as is fitted in the guide groove GG to regulate the turns of the slug 364 with respect to the intermediate external conductor 362*a*. In this case, the protrusion 364*a* constructs the turn regulating mechanism together with the guide groove GG.

When the impedance is to be matched by using this slug tuner 361, the individual ring-shaped external conductors 362*c* on the side of the slug 364 (or 365) to be position-changed are simultaneously turned. At this time, the two end portions of the intermediate internal conductor 363*a* are individually connected to the ring-shaped external conductors 362*c* through the insulating plates IN so that the intermediate internal conductor 363*a* is also simultaneously turned. On the other hand, the slug 364 (or 365), as threaded in the intermediate internal conductor 363*a*, is regulated from turning relative to the intermediate external conductor 362*a* by the turn regulating mechanism, which is constructed of the protrusion 364*a* and the guide groove GG, so that it relatively turns in the direction opposite to the turning direction of the intermediate internal conductor 363*a*. As a result, the slug 364 (or 365) is moved in the intermediate external conductor 362*a* in the longitudinal direction of the intermediate internal conductor 363*a*. As a result, the distance of the slug 364 (or 365) from the end portion of the external conductor 362 is changed to match the impedance. Thus, in this slug tuner 361, the position changing device for changing the position relative to the individual slugs 364 and 365 is constructed of the individual ring-shaped external conductors 362*c*, the intermediate internal conductor 363*a*, the insulating plates IN and the turn regulating mechanism.

Thus, according to this slug tuner 361, the slugs 364 and 365 are so constructed by making them movable from the outside of the external conductor 362 that an opening such as the slit SL can be avoided from being formed in the external conductor 362, while allowing the impedance to be matched from the outside. Therefore, it is possible to reduce the leakage of the electromagnetic waves drastically from the external conductor 362.

Tenth Embodiment

A slug tuner 371, as shown in FIG. 29, is an example of the coaxial type impedance matching device according to a tenth embodiment of the invention and is provided with an external conductor 372, an internal conductor 303 and dielectrics (or slugs) 374 and 375. Here, the same components as those of the slug tuner 301 will be omitted on their overlapped description by designating them by the common reference numerals. In the slug tuner 371, on the other hand, the individual slugs 374 and 375 have identical constructions. In the following, therefore, the construction on the side of the slug 374 will be described, but the description of the construction on the side of the slug 375 will be omitted.

Figure 30:
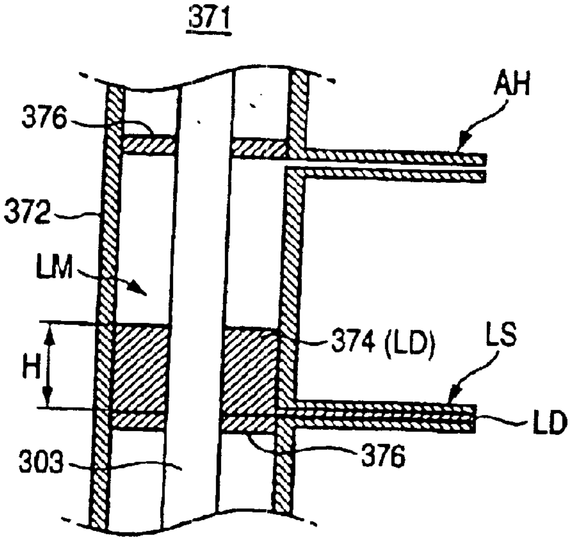
FIG. 30 is a sectional front elevation of the slug tuner 371 and taken on the side of a slug 374.

As shown in FIG. 30, the external conductor 372 is formed into a circular-cylinder shape (or a tubular shape) having a circular bore in the longitudinal direction at its central portion and is erected upright. Moreover, the external conductor 372 has liquid pumping ports LS formed thereon and air holes AH formed over and spaced from the liquid pumping ports LS. The liquid pumping ports LS are connected the not-shown pump for feeding a liquid dielectric (e.g., oil) LD. On the other hand, the air holes AH are made to communicate with the outside space of the external conductor 372. In this slug tuner 371, the external conductor 372 functions as the shielding mechanism as a hole.

As shown in FIG. 30, the internal conductor 303 is formed into a round bar shape (or a circular-column shape) and is so housed in the circular bore of the external conductor 372 that their axes may be aligned (or made coaxial) with each other. In this case, the internal conductor 303 constructs the signal transmission line together with the external conductor 372.

In the clearance between the inner face (or the inner circumference) of the external conductor 372 and the outer face (or the outer circumference) of the internal conductor 303, on the other hand, there are arranged a pair of cover members 376, which are made of a dielectric material and spaced from each other. In this case, the cover member 376 on the lower side is arranged slightly below the liquid pumping port LS, and the cover member 376 on the upper side is arranged slightly above the air hole AH. These cover members 376 and 376 form a liquid chamber LM with their opposed faces, the inner face of the external conductor 372 and the outer face of the internal conductor 303.

The slug 374 is formed of the liquid dielectric LD, which is fed from the pump to the inside of the liquid chamber LM via the liquid pumping port LS communicating with the lower side of the liquid chamber LM and reserved in the liquid chamber LM. In this case, the inside space of the liquid chamber LM is formed in a circular-cylinder shape so that the slug 374 to be formed with the liquid dielectric LD reserved in that liquid chamber LM is formed into the circular-cylinder shape.

When the impedance is to be matched by using this slug tuner 371, the pump is controlled to change the amount of the liquid dielectric LD to be reserved in the liquid chamber LM on the side of the slug 374 (or 375), the thickness of which is to be changed. As a result, the height (or thickness) of the slug 374 (or 375) to be formed with the liquid dielectric LD reserved in the liquid chamber LM is changed to do the impedance matching performance. In this case, the upper space of the liquid chamber LM is vented to the space outside of the external conductor 372 via the air holes AH so that the inside of the liquid chamber LM is kept at a constant pressure (or an atmospheric pressure) at all times. This makes it smooth to feed the liquid dielectric LD to the inside of the liquid chamber LM and to discharge the liquid dielectric LD from the liquid chamber LM.

Thus, according to this slug tuner 371, the slugs 374 and 375 are constructed to change their thickness from the outside of the external conductor 372 so that an opening such as the slit SL can be avoided from being formed in the external conductor 372, while allowing the impedance to be matched from the outside. Therefore, it is possible to reduce the leakage of the electromagnetic waves drastically from the external conductor 372. Unlike the foregoing other embodiments, moreover, the solid slugs slide in the external conductor so that the individual components can be prevented from being worn and degraded. As a result, it is possible to improve the durability. On the other hand, it is arbitrary that the slugs 374 and 375 could also be formed by feeding the liquid chamber LM with two or more kinds of liquid dielectrics LD of different specific gravities.

Here, the present invention should not be limited to the constructions of the foregoing embodiments. In the individual embodiments, for example, the number of slugs is two, but another construction having three or more slugs could be adopted, if necessary. In the slug tuner 301, on the other hand, the length La of each block member 6*a* is regulated to be equivalent to the length Lb of the individual slugs 304 and 305, with a view to reducing the electromagnetic waves the most efficiently with the shortest length and to preventing the interference between the individual block members 306*a* and 306*a* when the slugs 304 and 305 are brought close to each other, so that the slugs 304 and 305 may come into substantial contact with each other. In case the individual slugs 304 and 305 need not come into substantial contact with each other, however, the block member could be made longer. According to this construction, the effective area of the slit LS can be made smaller to further reduce the electromagnetic waves, as might otherwise leak from the slit SL.

Figure 31:
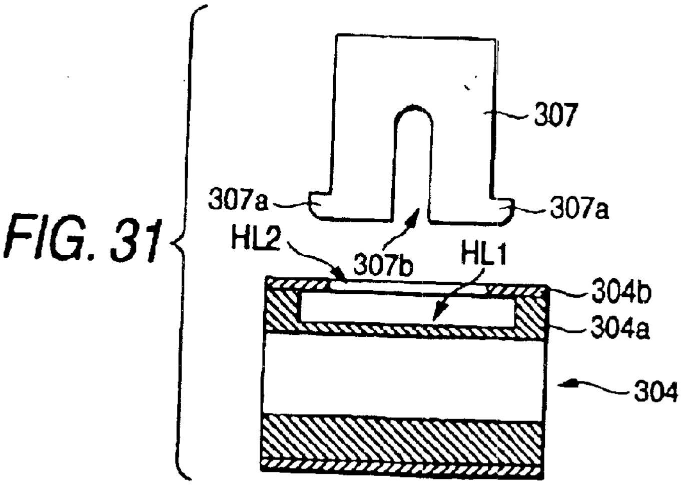
FIG. 31 is a sectional view showing a structure of a moving bracket 307 and a slug 304 in a slug tuner 301.

Moreover, the structure for mounting the moving brackets 307 on the individual slugs 304 and 305 could adopt such a construction as to fix them directly by adhering means or the like. However, it is possible to adopt the construction in which the slugs 304 and 305 can be mounted by a single action, as shown in FIG. 31. The slug 304 will be described by way of example. As shown in FIG. 31, the slug 304 is provided with a first dielectric 304*a* formed into such a circular-cylinder shape as can insert the internal conductor 303 thereinto, and a second dielectric 304*b* made diametrically larger than the first dielectric 304*a*, and is constructed by mounting the first dielectric 304*a* in the second dielectric 304*b*. Moreover, the first dielectric 304*a* and the second dielectric 304*b* have a fitting groove portion HL1 and a fitting slit HL2, respectively. In this case, the fitting slit HL2 is formed such that its opening length (or its slit length) taken along the axial direction of the internal conductor 303 is shorter than the fitting groove portion HL1 of the first dielectric 304*a*. As shown in FIG. 31, on the other hand, the moving bracket 307 is formed of an elastically deformable nonconductive material (e.g., polytetrafluoroethylene) into a rectangular shape as a whole and is provided with a slit 307*b* extending from one of the four sides toward the opposite side. Moreover, fitting pawl portions 307*a* and 307*a* are protruded on the two end portions of the side, which is separated by the slit 307*b*.

When the moving bracket 307 is to be mounted on the slug 4 thus constructed, the slotted portion (or the slit 307*b*) of the moving bracket 307 is pinched to push the side having the fitting pawl portions 307*a* and 307*a* into the fitting slit HL2. At this time, the moving bracket 307 is elastically deformed to shorten the distance between the fitting pawl portions 307*a* and 307*a* so that these fitting pawl portions 307*a* and 307*a* of the moving bracket 307 enter the fitting slit HL2 and proceed into the fitting groove portion HL1. When the individual fitting pawl portions 307*a* and 307*a* of the moving bracket 307 are completely fitted in the fitting groove portion HL1, the moving bracket 307 is caused by its elastic force to widen the distance between the fitting pawl portions 307*a* and 307*a* to the initial state. Therefore, the individual fitting pawl portions 307*a* and 307*a* take the state (or the fitting state), in which they always engage with the inner brim of the fitting slit HL2 so that the operation to mount the moving bracket 307 in the slug 304 is completed. Therefore, the moving bracket 307 can be easily mounted by the single action.

Moreover, the shape and arrangement of the individual cam grooves CG and CG in the slug tuner 311 or 321 are presented as an example, and another arbitrary shape and arrangement could be adopted. In the foregoing slug tuner 301, on the other hand, there could also be adopted a construction, in which the slug tuner 301 and the automatic moving mechanism are covered with a shielding case SC made of a conductive material, as shown in FIG. 13. In this case, the construction could also be modified by covering only the slug tuner 301 with the shielding case SC. By adopting this construction, it is possible to further reduce the electromagnetic waves, which might otherwise slightly leak from the slug tuner 301. Here, there could be adopted a construction, in which the slug tuner 311, 321, 331, 341, 351, 361 or 371 is covered like the slug tuner 301 with the shielding case SC, although not shown. In addition, the foregoing individual embodiments of the invention have been described on the example, in which the impedance between the amplifier AP and the antenna AT is matched. However, the application of the coaxial type impedance matching device according to the invention should not be limited thereto but could be used for matching the impedance between a variety of devices.

The coaxial type impedance matching device comprises: the tubular external conductor; the internal conductor arranged in the external conductor and constructing the transmission line for the signal together with the external conductor; and dielectrics arranged in the clearance between the inner face of the external conductor and the outer face of the internal conductor and made movable in the longitudinal direction of the internal conductor. Therefore, the leakage of the electromagnetic waves to the outside can be sufficiently reduced while making it possible to adjust the impedance from the outside.

According to the coaxial type impedance matching device of the invention, moreover: the external conductor has a slit formed in the longitudinal direction of the internal conductor; the position changing device includes moving brackets having their one end sides connected to the dielectrics and their other end sides protruded to the outside of the external conductor through the slit; and the shielding mechanism includes block members for blocking the slit partially or wholly while allowing the moving brackets to move along the slit. By operating the moving brackets while preventing the leakage of the electromagnetic waves to the outside with the block members, the dielectrics can be moved from the outer side of the external conductor to match the impedance.

According to the coaxial type impedance matching device of the invention, moreover, the block members are connected to the moving brackets so that they can move integrally with the dielectrics. Therefore, the vicinities of the dielectrics where the probability of leakage of the electromagnetic waves is the highest can be reliably blocked to reduce the leakage of the electromagnetic waves more reliably.

According to the coaxial type impedance matching device of the invention, moreover, the block members have a length, as taken in the longitudinal direction of the internal conductor, equivalent to that, as taken in the longitudinal direction, of the dielectrics. Therefore, it is possible to avoid the interference between the block members when a plurality of dielectrics are arranged in the external conductor. Therefore, the individual dielectrics can be brought so close as to contact with each other so that the range of adjustment of the impedance matching performance can be sufficiently widened.

According to the coaxial type impedance matching device of the invention, moreover, the dielectrics have fitting groove portions for fitting the moving brackets, and the moving brackets have a pair of fitting pawl portions to be fitted in the fitting groove portions. Merely by fitting the fitting pawl portions in the fitting groove portions, therefore, the moving brackets can be easily mounted by a single action on the dielectrics.

According to the coaxial type impedance matching device of the invention, moreover, the moving brackets are made of a nonconductive material. Even when a signal of a high output is inputted to the coaxial type impedance matching device, it is possible to avoid a spark between the internal conductor and the moving brackets reliably.

According to the coaxial type impedance matching device of the invention, moreover, the moving brackets move along the slit while being guided by the cam grooves, when the plate-shaped block members for closing the slit as a whole move relative to the external conductor, thereby to move the dielectrics in the longitudinal direction of the internal conductor. By moving the dielectrics in the external conductor while preventing the leakage of the electromagnetic waves from the slit, therefore, the impedance can be matched.

According to the coaxial type impedance matching device of the invention, moreover, the moving brackets move along the slit while being guided by the cam grooves, when the block members having the circular-cylindrical shape for blocking the slit as a whole turn, thereby to move the dielectrics in the longitudinal direction of the internal conductor. By moving the dielectrics in the external conductor while preventing the leakage of the electromagnetic waves from the slit, therefore, the impedance can be matched. Moreover, the block members do not protrude from the side of the external conductor so that the widthwise mounting are in the impedance matching device can be suppressed to the minimum.

According to the coaxial type impedance matching device of the invention, moreover: the shielding mechanism includes a dish member reserved with a liquid metal having a conductivity; the external conductor is so arranged in the dish member with the portion having the slit being directed downward, that the portion having the slit may be filled with the liquid metal; and the moving brackets are so arranged that the one end sides are buried in the liquid metal and that the other end sides are exposed from the liquid metal. Therefore, the slit can be completely blocked by the liquid metal so that the leakage of the electromagnetic waves from the slit can be completely prevented. By operating the other end sides of the moving brackets exposed from the liquid metal, moreover, the dielectrics can be moved in the external conductor thereby to match the impedance from the outside of the external conductor.

According to the coaxial type impedance matching device of the invention, moreover, the external conductor has through holes communicating the inside and outside thereof, and the position changing device includes rods inserted slidably into the through holes and connected at their inserted side leading end portions connected to the dielectrics. Therefore, it is possible to avoid the formation of the slit in the external conductor and to suppress the area of the opening portion to the minimum. As a result, it is possible to reduce the electromagnetic waves, as might otherwise leak from the external conductor to the outside. Moreover, the dielectrics can be moved in the external conductor merely by operating the rods so that the impedance can be matched from the outside of the external conductor.

According to the coaxial type impedance matching device of the invention, moreover: the external conductor includes: an intermediate external conductor having an internally threaded portion formed in its inner face; and a pair of end external conductors arranged across the intermediate external conductor for supporting the intermediate external conductor turnably; the dielectrics are formed into a ring shape having an externally threaded portion on its outer face; and the position changing device includes: the intermediate external conductor for threading the dielectrics therein; the internal conductor inserted in the central bores of the dielectrics; and a turn regulating mechanism interposed between the inner faces of the center bores of the dielectrics and the outer face of the internal conductor, for regulating the turns of the dielectrics with respect to the internal conductor while allowing the dielectrics to move in the longitudinal direction of the internal conductor. Without forming the opening such as the slit in the external conductor, therefore, the dielectrics can be moved from the outside of the external conductor. Therefore, the impedance matching performance can be done from the outside of the external conductor while reducing the electromagnetic waves, as might otherwise leak from the external conductor to the outside, far more.

According to the coaxial type impedance matching device of the invention, moreover, the external conductor includes: an intermediate external conductor; a pair of end external conductors arranged across the intermediate external conductor; and a pair of ring-shaped external conductors arranged slidably between the intermediate external conductor and the paired end external conductors, and the position changing device includes: the paired ring-shaped external conductors; the intermediate internal conductor; a pair of insulating plates for connecting the paired ring-shaped external conductors and the corresponding outer face of the intermediate internal conductor integrally; and a rotation regulating mechanism interposed between the outer faces of the dielectrics and the inner face of the intermediate external conductor, for regulating the turns of the dielectrics with respect to the intermediate external conductor while allowing the dielectrics to move in the longitudinal direction of the internal conductor. Without forming the opening portion such as the slit in the external conductor, therefore, the dielectrics can be moved from the outside of the external conductor. Therefore, the impedance matching performance can be done from the outside of the external conductor while further reducing the electromagnetic waves to leak from the external conductor to the outside.

According to the invention, moreover, the coaxial type impedance matching device comprises: a tubular external conductor erected upright; an internal conductor arranged in the external conductor for constructing a transmission line for a signal together with the external conductor; and a pair of cover members arranged in the clearance between the inner face of the external conductor and the outer face of the internal conductor and at a spacing from each other and made of a dielectric material for forming liquid chambers by their opposite faces together with the inner face of the external conductor and the outer face of the internal conductor. The external conductor includes: liquid pumping ports for pumping a liquid dielectric from the lower sides of the liquid chambers into the liquid chambers; and air holes communicating with the upper sides of the liquid chambers. Without forming the opening portion such as the slit in the external conductor, therefore, the height (or thickness) of the dielectrics can be changed from the outside of the external conductor. Therefore, the impedance matching performance can be done from the outside of the external conductor while reducing the electromagnetic waves to leak from the external conductor to the outside.

According to the invention, moreover, the coaxial type impedance matching device is covered with a shielding case. Therefore, it is possible to further reduce the leakage of the electromagnetic waves from the external conductor to the outside.

What is claimed is:

1. A coaxial type impedance matching device comprising:

a matching device body including a tubular external conductor and an internal conductor arranged in the external conductor;

an input side dielectric disposed in the matching device body and including a first dielectric and a second dielectric; and an output side dielectric disposed in the matching device body and including a third dielectric and a fourth dielectric, wherein:

the input side dielectric and the output side dielectric are slidable between a signal input portion of the matching device body and a signal output portion of the matching device body to adjust distance between a center position between the input side dielectric and the output side dielectric and one of the signal input portion and the signal output portion, and to adjust distance between opposed surfaces of the input side dielectric and the output side dielectric;

distance between opposed surfaces of the first dielectric and the second dielectric is a predetermined distance, which is in a range of $N\lambda/4-\lambda 6$ to $N\lambda/4+\lambda/6$, where $\lambda$ represents a guide wavelength of an input signal in the matching device body and N represents odd number; and distance between opposed surfaces of the third dielectric and the fourth dielectric is the predetermined distance.

2. The coaxial type impedance matching device according to claim 1, wherein the first dielectric and the second dielectrics are connected by a first connecting member in a state where the first dielectric and the second dielectric are spaced at the predetermined distance; and wherein the third dielectric and the fourth dielectrics are connected by a second connecting member in a state where the third dielectric and the fourth dielectric are spaced at the predetermined distance.

3. The coaxial type impedance matching device according to claim 2, further comprising moving mechanisms for moving the first connecting member and the second connecting member, respectively.

4. The coaxial type impedance matching device according to claim 1, wherein N is 1.

5. A coaxial type impedance matching device comprising:

a matching device body including a tubular external conductor and an internal conductor arranged in the external conductor;

an input side dielectric disposed in the matching device body; and an output side dielectric disposed in the matching device body, wherein:

the input side dielectric and the output side dielectric are slidable between an signal input portion of the matching device body and a signal output portion of the matching device body;

the matching device body includes a connector portion for connecting to an external device; and the internal conductor and the external conductor protrude by a predetermined length from at least one of the signal input portion and the signal output portion to form the connector portion.

6. The coaxial type impedance matching device according to claim 5, wherein the internal conductor and the external conductor protrude by a predetermined length from both of the signal input portion and the signal output portion to form the connector portion.

7. The coaxial type impedance matching device according to claim 5, wherein:

the internal conductor form a center electrode of the connector portion;

an inserting hole to which a center electrode of a connection object is inserted is formed at the center electrode of the connector portion; and the external conductor has a length not shorter than the internal conductor so that the external conductor forms an external electrode of the connector portion.

8. The coaxial type impedance matching device according to claim 5, further comprising holding dielectrics disposed individually at positions corresponding to the signal input portion and the signal output portion of the matching device body, the holding dielectrics for holding the internal conductor at a predetermined position in the external conductor.

9. The coaxial type impedance matching device according to claim 5, wherein the external conductor is formed of a cylindrical member.

10. The coaxial type impedance matching device according to claim 5, further comprising brackets fixed on the input side dielectric and the output side dielectric, respectively, wherein:

the external conductor has a slit formed between the signal input portion and the signal output portion, the slit for allowing each of brackets to protrude to an outside of the external conductor and to slide.

11. The coaxial type impedance matching device according to claim 10, wherein:

the input side dielectric and the output side dielectric have fitting groove portions for fitting the brackets, respectively; and each of brackets have a pair of fitting pawl portions to be fitted in the fitting groove portions.

12. A coaxial type impedance matching device comprising:

a tubular external conductor;

an internal conductor disposed in the external conductor and constructing a transmission line for a signal together with the external conductor;

dielectrics disposed in clearance between an inner face of the external conductor and an outer face of the internal conductor, the dielectric being movable in a longitudinal direction of the internal conductor;

position changing means for changing a position of the dielectric in the longitudinal direction of the internal conductor from outside of the external conductor; and a shielding mechanism for reducing leakage of electromagnetic waves caused by the signal.

13. The coaxial type impedance matching device according to claim 12, wherein:

the external conductor has a slit formed in the longitudinal direction of the internal conductor;

the position changing means includes moving brackets, one end of which are connected to the dielectrics and the other ends of which protrude to the outside of the external conductor through the slit; and the shielding mechanism includes block members for blocking the slit at least partially while allowing the moving brackets to move along the slit.

14. The coaxial type impedance matching device according to claim 13, wherein the block members are connected to the moving brackets so that the block members move integrally with the dielectrics.

15. The coaxial type impedance matching device according to claim 13, wherein:

the dielectrics have fitting groove portions for fitting the moving brackets; and each of moving brackets has a pair of fitting pawl portions to be fitted in each of fitting groove portion.

16. The coaxial type impedance matching device according to claim 13, wherein:

each of block members is formed into a plate shape, and has a length so as to block the slit as a whole, and is disposed to be relatively movable with respect to the external conductor at a portion where the slit is formed;

cam grooves are formed on a surface of the block members where the block members face to the external conductor, the cam grooves into which the other ends of the moving brackets enter intersect the longitudinal direction of the internal conductor obliquely; and when the block members move relative to the external conductor, the moving brackets move along the slit in a state where the moving brackets are guided by the cam grooves, to move the dielectrics in the longitudinal direction of the internal conductor.

17. The coaxial type impedance matching device according to claim 13, wherein:

the block members are formed into a plate shape, and have a length so as to block the slit as a whole, and are disposed to be parallel to the external conductor and to be turnable at a portion where the slit is formed;

cam grooves are formed on outer surfaces of the block members so that the other ends of the moving brackets enter into the cam grooves and the cam grooves intersect the longitudinal direction of the internal conductor obliquely; and when the block members turns, the moving brackets moves along the slit in a state where the moving bracket are guided by the cam grooves, to move the dielectrics in the longitudinal direction of the internal conductor.

18. The coaxial type impedance matching device according to claim 13, wherein:

the shielding mechanism includes a dish member reserved with a liquid metal having conductivity;

the external conductor is arranged in the dish member with a portion where the slit is formed faces downward so that the portion where the slit is formed is filled with the liquid metal; and the moving brackets are disposed so that the one ends thereof are buried in the liquid metal and that the other ends thereof are exposed from the liquid metal.

19. The coaxial type impedance matching device according to claim 12, wherein the external conductor has through holes communicating inside and outside thereof; and the position changing means includes rods inserted slidably into the through holes and connected to the dielectrics at inserted side leading end portions thereof.

20. A coaxial type impedance matching device comprising:

a tubular external conductor erected upright;

an internal conductor disposed in the external conductor, for constructing a transmission line for a signal together with the external conductor; and a pair of cover members disposed in clearance between an inner face of the external conductor and an outer face of the internal conductor, the cover members disposed at a spacing from each other, wherein:

opposed surfaces of the cover members, the inner face of the external conductor, and the outer face of the internal conductor form a liquid chamber; and the external conductor includes:

a liquid pumping port for pumping a liquid dielectric from a lower side of the liquid chamber into the liquid chamber; and an air hole communicating with an upper side of the liquid chamber.

21. The coaxial type impedance matching device according to claim 12, further comprising a shielding case covering the coaxial type impedance matching device to reduce leakage of electromagnetic waves caused by the signal.

* * * * *